US010133626B2

(12) United States Patent
Kern et al.

(10) Patent No.: US 10,133,626 B2
(45) Date of Patent: Nov. 20, 2018

(54) ERROR CORRECTION USING WOM CODES

(71) Applicant: Infineon Technologies AG, Neubiberg (DE)

(72) Inventors: Thomas Kern, Aschheim (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 15/232,323

(22) Filed: Aug. 9, 2016

(65) Prior Publication Data

US 2017/0046222 A1 Feb. 16, 2017

(30) Foreign Application Priority Data

Aug. 14, 2015 (DE) .................... 10 2015 113 414

(51) Int. Cl.
| | |
|---|---|
| *G06F 11/10* | (2006.01) |
| *G06F 3/06* | (2006.01) |
| *G11C 29/52* | (2006.01) |
| *G11C 17/14* | (2006.01) |
| *G11C 29/04* | (2006.01) |
| *G11C 29/44* | (2006.01) |

(52) U.S. Cl.
CPC ........ *G06F 11/1044* (2013.01); *G11C 17/146* (2013.01); *G11C 29/52* (2013.01); *G11C 2029/0411* (2013.01); *G11C 2029/4402* (2013.01)

(58) Field of Classification Search
CPC ............... G06F 11/1068; G11C 17/146; G11C 2029/4402; G11C 29/52; G11C 2029/0411
See application file for complete search history.

(56) References Cited

U.S. PATENT DOCUMENTS

| | | | |
|---|---|---|---|
| 4,691,299 A | 9/1987 | Rivest et al. | |
| 9,607,690 B2* | 3/2017 | Hua ................... | G11C 11/5628 |
| 2013/0091402 A1* | 4/2013 | Yaakobi .............. | G06F 11/1012 |
| | | | 714/755 |
| 2016/0211015 A1* | 7/2016 | Hua ................... | G11C 11/5628 |
| 2016/0224408 A1* | 8/2016 | En Gad ............... | G06F 11/1008 |
| 2016/0328289 A1* | 11/2016 | Zhang ................. | G11C 29/52 |

FOREIGN PATENT DOCUMENTS

| | | |
|---|---|---|
| CN | 103150261 A | 6/2013 |
| CN | 103218270 A | 7/2013 |

OTHER PUBLICATIONS

Rivest, Richard et al. " How to Reuse a"Write Once" Memory". Academic Press. vol. 55, Nos. 1-3, Oct./Nov./Dec. 1982. pp. 1-20.
Cho, Sanyeun et al. "Flip-in-Write: A Simple Deterministic Technique to Improve PRAM Write Performance, Energy and Endurance." Micro '09. Dec. 12-16, 2009. pp. 347-357.

* cited by examiner

*Primary Examiner* — Kyle Vallecillo
(74) *Attorney, Agent, or Firm* — Eschweiler & Potashnik, LLC

(57) ABSTRACT

A method is proposed for storing bits in memory cells of a memory, wherein in two successive write operations first and second wits are written to identical memory cells at an identical address, without the memory cells being erased after the first write operation, wherein first check bits are stored in further first memory cells and second check bits are stored in further second memory cells. A corresponding device is furthermore specified.

37 Claims, 6 Drawing Sheets

Fig.2

| $a_1, a_2, a_3$ | $Z^1, \ldots, Z^6$ | $Z^7, \ldots, Z^{13}$ | $Z^{14}, \ldots, Z^{19}$ |
|---|---|---|---|
| 101 | | | |
| 204 | 201 | 202 | 203 |

Fig.3

| $a_1, a_2, a_3, a_4$ | $Z^1, \ldots, Z^6$ | $Z^7, \ldots, Z^{12}$ | $Z^{13}, \ldots, Z^{18}$ |
|---|---|---|---|
| 1010 | 1 0 0 1 0 1 | 0 0 1 0 1 1 | 0 0 0 0 0 0 |
| 1011 | 0 0 1 0 0 1 | 1 0 1 0 1 1 | 0 0 0 0 0 0 |
|  | 301 | 302 | 303 |

Fig.4

$a_1, a_2, a_3, a_4$ | $Z^1, \ldots, Z^6$ | $Z^7, \ldots, Z^{12}$ | $Z^{13}, \ldots, Z^{18}$

| 1010 | 1 0 0 1 0 | 0 1 1 1 1 0 | 0 0 0 0 0 0 |

404 — 401 — 402 — 403

Fig.5a $a_1, \ldots, a_5$ | $Z^1, \ldots, Z^9$ | $Z^{10}, \ldots, Z^{14}$ | $Z^{15}, \ldots, Z^{19}$

| 10011 | 1 0 0 0 0 0 0 0 0 | 0 0 0 0 1 | 0 0 0 0 0 |

504 — 501 — 502 — 503

Fig.5b $a_1, \ldots, a_5$ | $Z^1, \ldots, Z^9$ | $Z^{10}, \ldots, Z^{14}$ | $Z^{15}, \ldots, Z^{19}$

| 10011 | 1 0 0 0 0 0 0 0 0 | 1 1 1 1 0 | 0 0 0 0 0 |

504 — 501 — 502 — 503

ERROR CORRECTION USING WOM CODES

CROSS REFERENCE TO RELATED APPLICATIONS

This application claims priority to German Application No. 10 2015 113 414.4, filed on Aug. 14, 2015, and incorporated herein by reference in its entirety.

FIELD

The approach described here relates, in particular, to storing data in addressable memories.

SUMMARY

By way of example, the data are written to the memory at an address in at least two successive write operations, without the need to erase the data that are written to the memory in a first write operation and are stored as states in memory cells of the memory if data are written to the memory in a second write operation that succeeds the first write operation.

Consideration is given here, in particular, to such memories which have memory cells which can assume at least a first value and a second value as states, wherein the first value is different than the second value. The first value is designated by 0 here by way of example and the second value is designated by 1 by way of example.

It is assumed by way of example below that the memory cell has the state 0 if it has the value 0, and that it has the state 1 if it has the value 1. This assignment is by way of example and could also be defined oppositely.

The memory cell, if it is initially in the state 0, can subsequently remain in this state 0 if the value 0 is written. Correspondingly, the memory cell can change from the state 0 to the state 1 if the value 1 is written.

If the memory cell is in the state 1, in this example it is not possible for said memory cell to acquire the value 0 by means of a write operation and to change to the state 0. Provided that the memory cell is in the state 1, only a value 1 can be written with the result that the memory cell remains in the state 1.

It should be noted here that writing to the memory cell corresponds to programming the memory cell or the memory (comprising the memory cell).

Furthermore, joint erasure of memory cells of a memory area is known in the case of the memories under consideration. In this case, the memory cells of the memory area are transferred to the state 0.

Examples of the memories discussed here are so-called flash memories.

For a multiplicity of different types of memories it is possible in a first write operation to an erased memory area (that is to say a memory area in which all the memory cells have the state 0) to write the value 0 or the value 1 to arbitrary memory cells, such that these memory cells successfully change to the state 0 or 1 corresponding to said value, and in a subsequent second write operation, to write the value 0 or the value 1 to those memory cells which are still in the state 0 after the first write operation.

However, those memory cells to which the value 1 was written in the first write operation can only have the value 1 written to them in the second write operation. Provided that these memory cells were not erased in the meantime, they cannot change from the state 1 to the state 0 by means of the writing of the value 0.

In order to successfully write to memory cells of such memories efficiently in a plurality (t where t≥2) of successive write operations, without the memory cells having to be erased in the meantime, so-called WOM codes (WOM: write once memory) are used. Such WOM codes are known for example from [Rivest, R.; Shamir, A.: "How to Reuse a 'Write-Once' Memory", Information and Control, vol. 55, Nos. 1-3, pages 1 to 19, 1982] or from U.S. Pat. No. 4,691,299.

A WOM code can be described by parameters $$(N_W, n_W, t)$$

wherein $N_W$ denotes a number of wits (also referred to as useful data wits) of a block, $n_W$ denotes a number of data bits (also referred to as useful data bits or bits) of the block which are coded as a block of $N_W$ wits, and t denotes a number of write operations in which $n_W$ data bits coded as $N_W$ wits can be written to the memory.

A WOM code can be used to transform or code data such that they can be written to a memory or overwritten in successive write operations, without data stored in the memory beforehand having to be erased.

By way of example, it is (initially) assumed that no error has occurred.

The data bits to be stored are divided into blocks of in each case $n_W$ bits. If $n_W=11$, for example, a first block extends from the first bit up to and including the eleventh bit, a second block comprises bits 12 to 22, etc.

Alternatively, the first block can contain bits 1 to 5 and 12 to 17, for example. The second block could contain bits 6 to 11 and 18 to 22 in this example.

In this respect, it is necessary for the $n_W=11$ bits to be arranged adjacent to one another (logically and/or physically). In this regard, arbitrary bit combinations of in each case n=11 bits can form a block. All that is demanded is that different blocks do not have common bits.

If $n_W=2$, for example, the $1^{st}$ bit and the $2^{nd}$ bit can form a first block, the $3^{rd}$ bit and the $4^{th}$ bit can form a second block, the $5^{th}$ bit and the $6^{th}$ bit can form a third block, the $7^{th}$ bit and the $8^{th}$ bit can form a fourth block, etc. It is also possible for the $1^{st}$ bit and the $3^{rd}$ bit to form the first block, the $2^{nd}$ bit and the $4^{th}$ bit to form the second block, the $5^{th}$ bit and the $7^{th}$ bit to form the third block, the $6^{th}$ bit and the $8^{th}$ bit to form the fourth block, etc. Other bit combinations can also be used for block formation.

Hereinafter, for the sake of clarity of illustration, it is assumed by way of example that for n=2 the $1^{st}$ bit and the $2^{nd}$ bit form the first block, the $3^{rd}$ bit and the $4^{th}$ bit form the second block, the $5^{th}$ bit and the $6^{th}$ bit form the third block, etc.

If the number of bits is odd, then for example an additional bit having a constant value can be added.

A block of $n_W$ useful data bits is transformed into a block of $N_W$ useful data wits by a WOM code before being written to the memory. Upon read-out, a block of $N_W$ useful data wits is transformed back into $n_W$ useful data bits. It holds true here that $N_W > n_W$.

If two $n_W$-tuples $x^1 = x_1^1, \ldots, x_{n_W}^1$ and $x^2 = x_1^2, \ldots, x_{n_W}^2$ of useful data bits for example of the first block of $n_W$ useful data bits are intended to be written in the memory in two successive write operations, in accordance with the WOM code used the first $n_W$ useful data bits $x^1$ are transformed into $N_W$ first useful data wits $y^1=y_1^1, \ldots, y_{N_W}^1$ and also the second useful data bits $x^2$ are transformed into second useful data wits $y^2=y_1^2, \ldots, y_{N_W}^2$, wherein $$y^1=y_1^1, \ldots, y_{N_W}^1=f^1(x^1)=f^1(x_1^1, \ldots, x_{n_W}^1) \quad (1)$$

and $$y^2 = y_1^2, \ldots, y_{N_W}^2 = \begin{cases} f^1(x^2) \text{ for } x^2 = x^1 \\ f^2(x^2) \text{ for } x^2 \neq x^1 \end{cases} \quad (2)$$

The components $y_1^1, \ldots, y_{N_W}^1$ and $y_1^2, \ldots, y_{N_W}^2$ of the $N_W$ useful data wits like the components $x_1^1, \ldots, x_{n_W}^1$ and $x_1^2, \ldots, x_{n_W}^2$ of the $n_W$ useful data bits assume binary values here.

When a WOM code is used, the components of the useful data wits are referred to as "wits" instead of "bits". The wits are the binary values which can be written to the memory cells and overwritten in the successive write operations.

It is also possible that, in the case of multi-level memory cells whose states can assume more than two values, the wits can have more than two values. In such a case, the wits would accordingly be multi-level values instead of binary values.

If the $n_W$ useful data bits $x^1$ and $x^2$ to be stored of the considered block (here of the first block) of $n_W$ useful data bits correspond in the first write operation and in the second write operation, they are transformed into respectively identical $N_W$ useful data wits $y^2=f^1(x^2)=f^1(x^1)$ by the same function $f^1$ Said useful data wits are stored in $N_W$ memory cells.

If the $n_W$ useful data bits $x^1$ and $x^2$ to be stored of the considered block (here of the first block) of $n_W$ useful data bits do not correspond in the first and second write operations, the $N_W$ useful data wits $y^1$ to be written to the memory in the first write operation are formed from the first $n_W$ useful data bits $x^1$ in accordance with the relationship $y^1=f^1(x^2)$, whereas the $N_W$ useful data wits $y^2$ to be written in the second write operation are determined in accordance with the relationship $y^2=f^2(x^2)$, wherein $f^1 \neq f^2$ holds true.

The functions $f^1$ and $f^2$ are defined such that the following holds true:

$$y^1 \lor y^2 = f^1(x^1) \lor f^2(x^2) = y_1^1 \lor y_2^2, \ldots, y_{N_W}^1 \lor y_{N_W}^2 = y_1^2, \ldots, y_{N_W}^2 = y^2 \quad (3)$$

wherein $\lor$ is the logical disjunction where $0 \lor 0=0$, $1 \lor 0=0 \lor 1=1 \lor 1=1$.

It is evident from equation (3) that a useful data with $y_i^2$ in the second write operation can be equal to 0 only if $y_i^1$ in the first write operation is also equal to 0.

If it is not known or not stipulated whether $x^1=x^2$ or $x^1 \neq x^2$, then the following can be defined:

$$y^2=f^{i2}(x^2), \quad (4)$$

wherein $i_2=1$ for $x^2=x^1$ or for $x^1=0$ and $i_2=2$ for $x^1 \neq x^2$ where $x_2 \neq 0$.

A WOM code having $n_W=2$ bits and $N_W=3$ wits is explained by way of example below.

Tuples $x_1, x_2$ of useful data bits can be transformed by the functions $f^1$ and $f^2$ into triples of useful data wits $$y_1^1, y_2^1, y_3^1=f^1(x_1,x_2) \text{ and } y_1^2, y_2^2, y_3^2=f^2(x_1,x_2)$$

in accordance with the following table:

| | | $f^1(x_1, x_2)$ | | | $f^2(x_1, x_2)$ | | |
|---|---|---|---|---|---|---|---|
| $x_1$ | $x_2$ | $y_1^1$ | $y_2^1$ | $y_3^1$ | $y_1^2$ | $y_2^2$ | $y_3^2$ |
| 0 | 0 | 0 | 0 | 0 | 1 | 1 | 1 |
| 0 | 1 | 0 | 0 | 1 | 1 | 1 | 0 |
| 1 | 0 | 1 | 0 | 0 | 0 | 1 | 1 |
| 1 | 1 | 0 | 1 | 0 | 1 | 0 | 1 |

In a first write operation, in accordance with the function $f^1$, two first useful data bits $x_1$, $x_2$ of a first block are transformed into a block of three first useful data wits. The three useful data wits are stored at an address a in three memory cells.

In a subsequent second write operation, two second useful data bits $x'_1$, $x'_2$ of the first block are transformed into three second useful data wits and the three useful data wits formed are stored at the same address a in the three memory cells in which the three first useful data wits have already been stored, without these memory cells having to be erased beforehand.

If it holds true that $x_1, x_2=x'_1, x'_2$, both the first three useful data wits and the second three useful data wits are formed using the function $f^1$, and the three useful data wits written to the three memory cells in the first write operation are overwritten with the same values. The three memory cells thus remain unchanged.

If it holds true that $x_1, x_2=0,0$, both the first three useful data wits and the second three useful data wits are formed using the function $f^1$ since $f^1(0,0)=0,0,0$ and the value 0,0,0 can be overwritten by an arbitrary value $f^1(x'_1,x'_2)=y'_1,y'_2,y'_3$ in an error-free manner. In principle, it is also possible to overwrite the value 0,0,0 with $f^2(x'_1,x'_2)$; in one embodiment, however, the function $f^1(x'_1,x'_2)$ can be used to write overall fewer 1 values to the memory.

If it holds true that $x_1,x_2 \neq x'_1,x'_2$, the first three useful data wits are formed from $x_1$, $x_2$ by means of the function $f^1$, while the second three useful data wits are formed from $x'_1$, $x'_2$ by means of the function $f^2$. The useful data wits formed in the first write operation are written to three memory cells, and in the second write operation the second three useful data wits are written to the same three memory cells. The coding of the useful data bits into useful data wits in accordance with the WOM code shown in the table above ensures that in the second write operation the value 0 may be written to a memory cell only if the value 0 has already been written to said memory cell in the first write operation.

If the useful data bits $x_1, x_2=0,1$ are intended to be stored in the first write operation, for example, they are transformed by the function $f^1$ into $f^1(0,1)=0,0,1$ in accordance with the above table and the useful data wits 0,0,1 are stored as states $z_1=0$, $z_2=0$, $z_3=1$ at an address a in three memory cells $Z^1, Z^2, Z^3$.

By way of example, the useful data bits $x'_1, x'_2=1,0$ are intended to be stored in a second write operation. Since $$x'_1, x'_2=1,0 \neq 0,1=x_1,x_2$$

holds true and the useful data bits of the first write operation are different than the useful data bits to be stored in the second write operation, the useful data bits 1,0 are transformed by the function $f^2$ into useful data wits $f^2(1,0)=0,1,1$ and are stored as states $z_1=0$, $z_2=1$, $z_3=1$ in the memory cells $Z^1$, $Z^2$, $Z^3$. That is possible without problems because no memory cell having the value 1 has to be overwritten with a value 0 in the second write operation. To put it another way it holds true that $$f^1(0,1) \vee f^2(1,0) = (0,0,1) \vee (0,1,1) =$$
$$= 0 \vee 0, 0 \vee 1, 1 \vee 1 =$$
$$= 0, 1, 1 =$$
$$= f^2(1,0).$$

In a further example, the useful data bits $x_1, x_2=0,1$ are intended to be stored in the first write operation. A transformation is carried out by means of the function $f^1$ into $f^1(0,1)=0,0,1$ in accordance with the table.

If the useful data bits $x'_1, x'_2=0,1$ which are identical to the useful data bits stored in the first write operation are intended to be stored in the second write operation, in the second write operation as well the useful data bits $x'_1, x'_2=0,1$ are transformed by the function $f^2=f^1$ into $f^1(0,1)=0,0,1$ and are written to the memory cells $Z^1, Z^2, Z^3$. The states $z_1=0, z_2=0, z_3=1$ remain unchanged.

If the useful data bits $x'_1, x'_2$ are to be stored in the second write operation, then on the basis of the states $z_1, z_2, z_3$ of the memory cells $Z^1, Z^2, Z^3$ it should be ascertained whether or not the data bits $x_1, x_2$ stored in the first write operation are equal to $x'_1, x'_2$. After the first write operation, the corresponding useful data wits are stored as states $z_1, z_2, z_3$ and it holds true that $$x_1 = z_1 \oplus z_2 \text{ and } x_2 = z_2 \oplus z_3. \quad (5)$$

Furthermore, the data bits $x_1, x_2$ calculated from the states stored in the memory cells are to be compared with the data bits $x'_1, x'_2$ to be stored in the second write operation. If this comparison reveals that the data bits that are to be stored in the first write operation are equal to the data bits that are to be stored in the second write operation, the data bits $x'_1, x'_2$ are transformed into useful data wits by means of the function $f^1$ and are stored as useful data wits. By contrast, if this comparison reveals that the data bits that are to be stored in the first write operation are not equal to the data bits that are to be stored in the second write operation, the data bits $x'_1, x'_2$ are transformed into useful data wits by means of the function $f^2$ and are stored as useful data wits.

In the example described, twice in each case 2 bits coded into 3 wits can be stored in successive write operations. Without such a transformation, a memory space of 4 bits would be necessary for this purpose.

The transformation of the bits into wits and the transformation of the wits into bits can be represented as follows:

$$y_1^1 = x_1 \wedge \overline{x_2},$$
$$y_2^1 = x_1 \wedge x_2,$$
$$y_3^1 = \overline{x_1} \wedge x_2,$$
$$y_1^2 = \overline{\overline{x_1} \wedge \overline{x_2}} = \overline{y_1^1},$$
$$y_2^2 = \overline{\overline{x_1} \wedge \overline{x_2}} = \overline{y_2^1},$$
$$y_3^2 = \overline{\overline{x_1} \wedge \overline{x_2}} = \overline{y_3^1},$$
$$x_1 = y_1^1 \oplus y_2^1,$$
$$x_2 = y_2^1 \oplus y_3^1,$$
$$x'_1 = y_1^2 \oplus y_2^2,$$
$$x'_2 = y_2^2 \oplus y_3^2,$$

Further WOM codes are known alongside the WOM code presented by way of example in the table above. By way of example, 11 data bits could be transformed into 23 data wits by means of a WOM code, such that three times 11 bits can be coded as 23 wits and written to a memory, without the memory having to be erased.

The approach described here is applicable in particular to arbitrary WOM codes.

Permanent and/or transient errors that can alter values of states of the memory cells occur in memories. It is advantageous to detect and/or to correct such errors.

In the case of a flash memory the effect occurs, for example, that as the age of the memory increases, when erasing memory blocks, individual bits are no longer erased to zero, but rather remain in the state 1 despite the erasure operation.

Error detecting or error correcting WOM codes are known for example from US 2013/0091402 A1. In that case the useful data bits to be stored and also the redundancy information required for error detection are represented as WOM-coded wits.

Furthermore, what is disadvantageous in the case of known error detecting or error correcting WOM codes is that in the case of an address error, instead of the desired word, a different word is read from the memory, but said word cannot be detected as erroneous since it is a valid code word stored at a different address (determined erroneously here).

It is desirable, therefore, to overcome the disadvantages mentioned above. In particular, the error detection and/or error correction can be improved with the solutions described here. By way of example, the error detection and/or error correction of memory errors can be improved, wherein data stored in a memory are coded at least partly with WOM codes.

A method is proposed for storing bits in memory cells of a memory, wherein in two successive write operations first and second wits are written to identical memory cells at an identical address, without the memory cells being erased after the first write operation, wherein first check bits are stored in further first memory cells and second check bits are stored in further second memory cells.

One development comprises the following:

a first code word of a first error code is determined on the basis of the first wits and the first check bits, a second code word of a second error code is determined on the basis of the second wits and the second check bits.

The steps of the method explained here can be carried out in particular by an electronic apparatus. The electronic apparatus can involve memory apparatuses, in particular those which comprise at least one memory. The electronic apparatus can comprise a processing unit, e.g. a processor or a (micro)controller. The electronic apparatus can be or comprise a memory management. The electronic apparatus can be an apparatus which at least partly uses a WOM code.

It should be noted here that the memory is an addressable memory. By way of example, a partial area of the memory comprising a predefined number of bits can be selected via an address. At this address (or under this address) a plurality of bits can be stored and read.

The memory mentioned here can comprise an individual physical memory or a plurality of physical memories. In particular, the memory can comprise physical memories of different types. In one option, the memory can be addressed via a (possibly common) memory management, without the underlying physical structure being of importance. In accordance with this option, the memory management can provide the service of managing the memory, wherein different physical memories (of the same type or of different types) can be used by the memory management.

Furthermore, it should be noted that the wording "wherein in two successive write operations first and second wits are written to identical memory cells at an identical address, without the memory cells being erased after the first write operation" takes account of the property of a WOM code (WOM stands for "write once memory" in German analogously: writing to the memory is possible only in one direction) according to which it is possible for information to be written multiply (at least twice) to a formerly erased memory area, without the memory having to be erased between the repeated write operations. This is based on the assumption that a state change of a bit from "erased" (e.g. value 0) to "written" (e.g. value 1) is possible, but the opposite path can be achieved only via an erasure operation.

The wits are transformed (useful data) bits. The actual useful data (also referred to as data, bits, payload) are transformed into wits (also referred to as data wits or useful data wits) on the basis of the WOM code. The wits are stored in (at least two) successive write operations to common memory cells or in one write operation to a memory previously occupied with binary values, in which not all the memory cells have the value 0 for example after erasure (the erasure operation in this respect therefore could not be carried out successfully for all the memory cells).

Consequently, the approach presented here allows storage of useful data, wherein for example a first sequence of first data bits is coded into first data wits in accordance with the WOM code and a second sequence of data bits is coded into second data wits in accordance with the WOM code, wherein a non-empty subset of the first data wits in a first write operation and a non-empty subset of the second data wits in a second write operation can be written to identical memory cells for the storage of the data wits, without these identical memory cells having to be erased after the writing of the first data wits. Using the first data wits, the first check bits of the first error code $C^1$ are formed, which are written to the first further memory cells. Using the second data wits, the second check bits of the second error code $C^2$ are formed, which are written to the further second memory cells. The further first memory cells and the further second memory cells are optionally (at least partly) different than one another if a bit position of the first check bits has a first value and the same bit position of the second check bits has a second value different than the first value, and the first value cannot be overwritten by the second value without the first value being erased beforehand, or if the number of second check bits is greater than the number of first check bits.

Therefore, a method is also proposed for storing coded useful data bits in memory cells (of an addressable memory), the memory cells of which can assume at least two values designated by 0 and 1 as states. A memory cell has the state 0 after an error-free or successful erasure operation.

If the memory cell is in the state 0, then writing a value 0 has the effect that the memory cell remains in the state 0 and writing a value 1 has the effect that the memory cell changes to the state 1.

If the memory cell is in the state 1, then writing a value 0 has the effect that the memory cell remains in the state 1 and writing a value 1 has the effect that the memory cell remains in the state 1. Consequently, a state change of the memory cell from 1 to 0 is not possible without prior erasure.

In a write operation, at least two blocks of useful data bits are present which, before storage, are, in one embodiment, transformed block by block into blocks of wits using at least one WOM code, specifically depending on the states which the memory cells have before the write operation. By way of example, at least 6 wits are determined on the basis of the (blocks of useful data bits).

By way of example, in two successive write operations, in a first write operation first blocks of N first wits are written to the memory at an address a, then in the first write operation $m_1$ first check bits $c^1 = c_1^1, \ldots, c_{m1}^1$ are formed, such that the N first wits and the $m_1$ first check bits $c^1$ formed are bits of a code word of the first error code $C^1$ having at least the length $N+m_1$, wherein in particular $N>m_1$ holds true.

At least one of the first check bits can depend on a with of a first block of first wits and on a with of a second block of first wits.

In a second write operation, second blocks of N second wits are written to the memory at the same address a, then in the second write operation $m_2$ second check bits $c^2 = c_1^2, \ldots, c_{m2}^2$ are formed, such that the N second wits and the $m_2$ second check bits $c^2$ are bits of a code word of the second error code $C^2$ having at least the length $N+m_2$, wherein in particular $N>m_2$ holds true.

In one embodiment, at least one of the second check bits depends on a with of a first block of second wits and on a with of a second block of second wits.

If both the first and the second write operations take place at the same address a, the N first wits that are written to the memory at the address a in the first write operation and the N second wits that are written to the memory at the same address a in the second write operation are stored as states in the same memory cells of the memory, without the memory cells having the address a having to be erased after the first write operation for this purpose.

If both the first and the second write operations take place at the same address a, wherein the memory cells having the address a are not erased after the first write operation, then the $m_1$ first check bits $c^1$ in the first write operation are written at the address a to the $m_1$ further first memory cells for storing the check bits $c^1$ and the $m_2$ second check bits $c^2$ are written at the address a to the $m_2$ further second memory cells for storing the check bits $c^2$.

The further second memory cells can be at least partly different than the further first memory cells. This holds true e.g. if $m_2>m_1$ holds true or if the number of positions (components) of the second check bits which assume a value 0 while the corresponding positions (components) of the first check bits assume the value 1 is greater than a threshold value $S_1$, wherein $S_1 \geq 0$ holds true.

For $i=1,2$ the code $C^i$ has for example a code distance $d_i \geq 2$; the code $C^i$ can be used for the error detection of errors of wits read out from the memory if $d_i=2$ holds true, and the code $C^i$ can be used for the error detection or error correction of errors in wits read out from the memory if $d_i>2$. In particular, it is possible for erroneous wits to be corrected if the code $C^i$ is used for error correction. In this case, after the error correction the wits can be transformed back into the corresponding useful data bits in accordance with the WOM code used.

In another development, the number of first check bits is less than the number of first wits.

Moreover, in one configuration, the first wits and the second wits are determined on the basis of useful data bits by means of at least one WOM code.

Furthermore, in one configuration, at least one inversion bit is added to the useful data bits, wherein a subset of useful data bits is assigned to the at least one inversion bit.

In another configuration, the at least one inversion bit assumes a first value if the useful data bits assigned to the inversion bit are not inverted, and the inversion bit assumes a second value different therefrom if the useful data bits assigned to the inversion bit are inverted.

In another configuration, the respective wits are formed using the useful data bits and the inversion bit, wherein the useful data bits assigned to the at least one inversion bit are not inverted if the inversion bit has the first value, and wherein the useful data bits assigned to the at least one inversion bit are inverted if the inversion bit has the second value.

Consequently, in particular the wits of a block of wits are different for different values of the at least one inversion bit.

In one development, in the first write operation the first check bits are determined such that the first wits determined from the useful data bits and the at least one inversion bit and the first check bits are bits of the first code word, and wherein in the second write operation at the same address the second check bits are determined such that the second wits determined from the useful data bits and the at least one inversion bit and the second check bits are bits of the second code word.

In this case, the value of the at least one inversion bit in the first write operation is included in the formation of the first wits and in the formation of the first check bits and thus in the error detection or error correction using the first error code when reading out the stored values. Correspondingly, the value of the at least one inversion bit in the second write operation is included in the formation of the second wits and the second check bits and thus in the error detection or error correction when reading out the values from the memory using the second error code.

By virtue of the fact that the at least one inversion bit is WOM-coded together with the useful data bits, it also becomes part of the error correction.

In one option, the useful data bits are inverted before the formation of the corresponding wits if the wits formed using the inverted useful data bits and the associated check bits can be written to the corresponding memory cells with fewer errors than would be possible using the non-inverted useful data bits and associated check bits.

In another development, the useful data bits assigned to the at least one inversion bit are all useful data bits.

In another development, before the write operation, in memory cells to be addressed, the data stored there are read out, the data read out are compared with the data to be stored, the data to be stored are inverted if the data to be stored cannot be written to the memory in an error-free manner, the first wits or the second wits are determined on the basis of the inverted data by means of the at least one WOM code and are stored in the memory cells.

In an additional development, the first wits coded by means of the at least one WOM code are different than the second wits coded by means of the at least one WOM code.

Furthermore, in one configuration, at least one memory cell of the memory is not completely erased before the first writing, wherein the first wits and the second wits are coded by means of the at least one WOM code on the basis of the at least one not completely erased memory cell.

The WOM code can thus be used to code data bits as wits even though individual memory cells already have the value 1 instead of the value 0 as a result of the erroneous or incomplete erasure operation.

In another development, the first wits and the second wits are organized in each case as blocks, wherein two different codings are assigned to each occupancy of the bits of one of the blocks of the first wits by the at least one WOM code.

Consequently, at least one check bit can be dependent both on a with of a first block and on a with of a second block. In this case, the first block can be a subset of the first wits and the second block can be a subset of the second wits.

The respective check bits can optionally not just be determined from the wits of a single block, rather the check bits can be derived from a plurality of blocks.

In the present case, the first wits can be subdivided into blocks and the first check bits are determined on the basis of bits of a plurality of blocks (of the first wits). The same correspondingly applies to the second wits, which can be subdivided into blocks, and the second check bits, which are determined on the basis of bits of a plurality of blocks (of the second wits).

The useful data bits are transformed into useful data wits. It is an option to take account or not to take account of the respective check bits in the transformation.

The check bits $c^1$ and $c^2$ are generally stored in different memory cells in two successive write operations. However, if $c^1=0$ holds true for example, then the check bits $c^2$ can be stored in the same memory cells as the check bits $c^1$.

One option comprises transforming the check bits (at least partly) into wits. In this case, the check wits could then firstly be transformed back into check bits and the data wits could be corrected with the check bits thus obtained. The corrected data wits could subsequently be transformed back into useful data bits.

Moreover, in one development, the number of second check bits is less than the number of second wits.

Furthermore, in one development, the first error code is an error detecting code and/or an error correcting code, and wherein the second error code is an error detecting code and/or an error correcting code.

In one option, the first error code and the second error code constitute identical codes. Moreover, first error code and second error code can be different codes.

In another configuration, the first error code is a code having a code distance of greater than or equal to three.

In yet another configuration, the second error code is a code having a code distance of greater than or equal to three.

Moreover, in one development, the further first memory cells and the further second memory cells are different than one another.

Consequently, the first $m_1$ check bits that are written to the memory at an address a can be written to the further first memory cells and the second $m_2$ check bits that are written to the memory at the same address a in the second write operation can be written to the further second memory cells, wherein the further first memory cells and the further second memory cells can be different than one another.

In particular, the number of first check bits can be equal to the number of second check bits, i.e. $m_1=m_2$.

In one development, furthermore, if no error occurs, the first wits and the first check bits are a proper subset of bits of the first code word, or the second wits and the second check bits are a proper subset of bits of the second code word, or the first wits and the first check bits are a proper subset of the bits of the first code word and also the second wits and the second check bits are a proper subset of the bits of the second code word.

In particular, the first error code and the second error code are in each case a systematic code.

In one development, the length of the first error code is greater than the number of first wits and first check bits, and the length of the second error code is greater than the number of second wits and second check bits.

In an additional development, the first code word of the first error code is determined on the basis of the first wits, the first check bits and first additional bits, and wherein the second code word of the second error code is determined on the basis of the second wits, the second check bits and second additional bits.

The first additional bits are based on first further information and the second additional bits are based on second further information. The further information can comprise e.g.: indicator information, inversion information, password information, address information or derived address information.

In another configuration, when writing to the memory and/or when reading from the memory, the first wits, the first check bits and the first additional bits form the first code word and the second wits, the second check bits and the second additional bits form the second code word.

A code word is formed in particular if no error occurs.

In yet another configuration, the first additional bits and/or the second additional bits are based in each case at least on one of the following items of information:
address information,
address information concerning a write address or a read address,
information derived from address information,
identifier information,
password information,
inversion information.

In one development, an error in the first additional bits is detected and/or corrected, and/or an error in the second additional bits is detected and/or corrected.

In particular, it is an option that errors in the first additional bits can be (only) detected, but not corrected. If an error was detected (which error is not correctable or is not corrected), then a predefined action can be initiated. By way of example, an (error) message can be output.

In this regard, the correction of an address error could be omitted if the incorrect address was already used during the read access and a subsequent correction without a renewed read access to the correct address would possibly be pointless.

In accordance with another example, an error in the address information, e.g. in address bits or in bits derived therefrom, could be detected and not corrected.

In a further example, an error in the identifier information, e.g. in identifier bits, could be detected and not corrected.

Moreover, it is an option that an error in a combination of address and identifier information can be detected and not corrected.

In a further option, after a write operation in which blocks of wits and check bits were written to memory cells, the states of the memory cells are read out. If a number of errors in the data read out exceeds a value not correctable by the error code used, a predefined action can be carried out. By way of example, in such a case, the values stored in the memory cells can be erased or a different address can be used.

In one development, a marking is stored in the first further memory cells provided that the second check bits are stored in the further second memory cells.

If the $m_2$ second check bits formed in the second write operation are written to the $m_2$ further second memory cells, which differ for example from the further first memory cells to which the $m_1$ first check bits were written beforehand, the $m_1$ first memory cells are overwritten with an $m_1$-digit marking in the second write operation (or beforehand or afterward), wherein the $m_1$-digit marking is not a valid sequence of first check bits of the code word of the error code $C^1$.

In one configuration, the marking is a bit sequence that does not constitute a valid bit sequence of the first check bits.

Moreover, in one configuration, a partial area of the addressable memory is erased which comprises the address to which a write operation was applied if the first or second wits to be stored at $d_N$ positions do not have the desired state after the write operation and/or if the first check bits or the second check bits at $d_P$ positions do not have the desired state after the write operation.

In another configuration, a second partial area of the addressable memory is used if the first or second wits to be stored at $d_N$ positions do not have the desired state after the write operation to a first partial area and/or if the first check bits or the second check bits at $d_P$ positions do not have the desired state after the write operation.

In another configuration, the partial area is erased or the second partial area is used instead of the first partial area if it holds true that $$d_N + d_{P\_} \geq S_2,$$

wherein $S_2$ is a threshold value for which $S_2 \geq 0$ holds true.

In one development, the further first memory cells and the further second memory cells are different than one another if the first check bits cannot be overwritten by the second check bits without a predefined number of erroneous memory cells occurring.

In one configuration, the predefined number of erroneous memory cells is greater than or equal to 0.

In another configuration, the number of first check bits is greater than one, and wherein the number of second check bits is greater than one.

In another configuration, the addressable memory comprises at least one of the following types of memories:
a volatile memory;
a non-volatile memory.

Furthermore, in order to achieve the object cited above, a device is specified for storing bits in memory cells of a memory comprising a processing unit designed in such a way that in two successive write operations first and second wits are written to identical memory cells at an identical address, without the memory cells being erased after the first write operation, wherein first check bits are stored in further first memory cells and second check bits are stored in further second memory cells.

The processing unit mentioned here can be embodied in particular as a processor unit and/or an at least partly hardwired or logical circuit arrangement which is designed for example in such a way that the method as described herein can be carried out. Said processing unit can be or comprise any type of processor or computer with correspondingly required peripherals (memory, input/output interfaces, input/output devices, etc.).

The above explanations concerning the method correspondingly apply to the device. The device can be embodied in one component or in a distributed fashion in a plurality of components.

In one development, the processing unit is designed in such a way that a first code word of a first error code is determined on the basis of the first wits and the first check bits, a second code word of a second error code is determined on the basis of the second wits and the second check bits.

In one configuration, the device comprises the memory comprising the further first memory cells and the further second memory cells.

Moreover, in one configuration, the memory comprises a non-volatile memory and/or a volatile memory.

Furthermore, the advantages and features mentioned above is achieved using a system comprising at least one of the devices described here.

In particular one advantage of the approach described here is that a separable error detecting code or a separable error correcting code can be used efficiently for error correction and/or error detection.

Another advantage is that besides the WOM-coded wits further items of information (also referred to as additional bits) which are not WOM-coded can also be included in the error detecting code and/or error correcting code used. Examples of such items of information are bits of a read address or bits derived from the bits of the read address, e.g. an access right, a password or the like. In this case it is not necessary (but optionally it is possible) for said further items of information to be stored in the memory cells of the monitored memory.

Additional bits form for example bits of a read address and/or of a write address or derived bits of a read address and/or of a write address. Furthermore, additional bits can be determined as bits of a password or bits of an access right. Other examples for the use of additional bits are correspondingly possible.

Moreover, it is an advantage that the applicability of error detecting and/or error correcting codes to memories whose blocks are not completely erased is improved.

The above-described properties, features and advantages of this disclosure and the way in which they are achieved are described below in association with a schematic description of exemplary embodiments which are explained in greater detail in association with the drawings. In this case, identical or identically acting elements may be provided with identical reference signs for the sake of clarity.

BRIEF DESCRIPTION OF THE DRAWINGS

FIG. 2 shows memory cells comprising 6 memory cells for storing wits, comprising 7 memory cells for storing 7 check bits of a first code $C^1$ in a first write operation, and comprising 6 memory cells for storing 6 check bits of a second code $C^2$ in a second write operation, FIG. 3 shows occupancies of memory cells with the addresses 1010 and 1011, wherein the address bits are included in the formation of the check bits, FIG. 4 shows occupancies of memory cells with the address 1010 after the first write operation, wherein the parity of the address bits is incorporated in the formation of the check bits, FIG. 5a shows occupancies of memory cells after an incomplete erasure operation, FIG. 5b shows occupancies of the memory cells from FIG. 5a after a first write operation, wherein the useful data bits and an inversion bit were inverted before the formation of wits.

DETAILED DESCRIPTION

Error Detecting, Error Correcting Codes

Figure 1:
FIG. 1a shows completely erased memory cells at an address 10011.
FIG. 1b shows an occupancy of the memory cells from FIG. 1a after a first write operation using a WOM code.
FIG. 1c shows an occupancy of the memory cells from FIG. 1a after a second write operation using the same WOM code as in FIG. 1b.

An error detecting and/or error correcting code is also designated herein as error code.

An error code C of length n having k information bits can be described by its generator matrix G or its H-matrix H. In this case, the generator matrix is a (k, n) matrix and the H-matrix is an (n–k, n) matrix. It is possible to determine k information bits $u_1, \ldots, u_k$ in n bits of a code word $v = v_1, \ldots, v_n$ in accordance with $$v = v_1, \ldots, v_n = [u_1, \ldots, u_k] \cdot G = u \cdot G$$

If the generator matrix and the H-matrix are in systematic form, it holds true that $$G = (I_k, P_{k,m})$$

and $$H = (P_{m,k}^T, I_m)$$

where m=n–k. In this case $I_k$ is the k-dimensional identity matrix, $I_m$ is the m-dimensional identity matrix, $P_{k,m}$ is the (k, m) parity matrix, and $P_{m,k}^T$ is the transposed parity matrix obtained by interchanging rows and columns from the parity matrix $P_{k,m}$.

In the case of a systematic code, a possible H-matrix arises directly from the G-matrix. Furthermore, for systematic codes it holds true that:

$$v = u, c$$

$$v = u \cdot G$$

where $$u = u_1, \ldots, u_k \text{ and } c = c_1, \ldots, c_m.$$

Check bits $c_1, \ldots, c_m$ $$c_1, \ldots, c_m = [u_1, \ldots, u_k] \cdot P_{k,m}$$

are added to the information bits $u_1, \ldots, u_k$.

A word $v = v_1, \ldots, v_n$ is a code word of the code C if $$0| = H \cdot v^T \text{ or } \underbrace{0, \ldots, 0}_{m} = v \cdot H^T$$

wherein 0| here denotes an m-dimensional column vector.

If a matrix, here the matrix H, is multiplied from the left by a vector, here the vector v, then the vector v is a row vector. If a matrix, here the matrix H, is multiplied from the right by a vector $v^T$, then the vector $v^T$ is a column vector, wherein the vector $v^T$ is the transposed column vector of the row vector v.

If $$v'=v'_1, \ldots, v'_n = v \oplus e = v_1 \oplus e_1, \ldots, v_n \oplus e_n$$

is a word that emerged from a code word $v=v_1, \ldots, v_n$ as a result of errors, $e=e_1, \ldots, e_n$ is designated as error vector.

If it holds true that $e_i=1$ for $i \in \{1, \ldots, n\}$, then $v'_i = v_i \oplus 1 = \bar{v}_i$, and the i-th component $v'_i$ is erroneous. If it holds true that $e_i=0$ for $i \in \{1, \ldots, n\}$, then $v'_i = v_i \oplus 0 = v_i$, and the i-th component $v'_i$ is correct.

If the error vector e has a number of q components that are equal to 1, a q-bit error is present.

An error syndrome $s=s_1, \ldots, s_m$ is determined by $$s^T = H \cdot v'^T = H \cdot e^T$$

and $s^T$ is equal to $0|$ if the word v is a code word.

If the code C is a τ-bit error detecting code, then $s^T \neq 0|$ for all $1, \ldots, \tau$-bit errors.

If the code C is a t-bit error correcting code, then $s^T$ is different for all different $1, \ldots, t$-bit errors.

The Hamming distance $d(v^1, v^2)$ where $v^1 = v_1^1, \ldots, v_n^1$ and $v^2 = v_1^2, \ldots, v_n^2$ is equal to the number of bits in which $v^1$ and $v^2$ differ, such that it holds true that $$d(v^1, v^2) = \sum_{i=1}^{n} v_i^1 \oplus v_i^2,$$

wherein $\oplus$ is a component-by-component exclusive-OR logic function.

A code distance $d_{min}$ of a code is equal to the minimum Hamming distance between two different code words of the code C. If the code C is a linear code, then it holds true that $$d_{min} = \min(d(v^i, v^j); v^i, v^j \in C; v^i \neq v^j)$$

$$d_{min} = \min(w(v^k, v^k \in C)),$$

wherein $$w(v) = \sum_{j=1}^{n} v_j$$

denotes the Hamming weight of v, that is to say the number of ones of v.

If the code C is a t-bit error correcting code having the minimum code distance $d_{min}$, then t is determined in accordance with $$2t+1 \leq d_{min} \leq 2t+2$$

In this regard, for example, a code having the minimum code distance $d_{min}=3$ is a 1-bit error correcting code since $$2 \cdot 1 + 1 = 3 \leq 3 \leq 2 \cdot 1 + 2 = 4$$

holds true.

Known codes include linear codes and nonlinear codes. The Berger code (see e.g.

http://en.wikipedia.org/wiki/Berger_code) shall be mentioned here as an example of a nonlinear code.

From k information bits $u_1, \ldots, u_k$, in the Berger code the associated check bits $c_1, \ldots, c_m$ result as $$c_1, \ldots, c_m = \left( \sum_{i=1}^{k} \bar{u}_i \right)_{bin},$$

such that the binary representation of the sum of the number of values 0 of the information bits determines the check bits. The Berger code detects all unidirectional errors, i.e. errors which only corrupt zeros into ones or only correct ones into zeros.

Exemplary Embodiment: (3,2,2) WOM Code

Consideration is given to the case in which 3 blocks each composed of 2 useful data bits are stored as 3 blocks each composed of 3 useful data wits in a memory having the word width 19 at an address $a = a_1, \ldots, a_5$ having the word width 5. These 3 blocks of useful data bits form the first 6 useful data bits and the 3 blocks of useful data wits assigned to them form the first 9 useful data wits.

The useful data bits $x_1, x_2$ form the first block of the first useful data bits and are transformed into the first block of useful data wits $y_1, y_2, y_3$ using the WOM code described in the table.

Said WOM code is an $(N_W, n_W, t) = (3,2,2)$ WOM code. As already explained above, in this case $N_W$ denotes the number of (useful data) wits (that is to say of transformed bits), $n_W$ denotes the number of bits (also referred to as data bits or useful data bits), and t denotes the number of write operations in which $n_W$ bits coded as $N_W$ wits can be written to the memory at an address a, without the memory having to be erased in the meantime.

The useful data bits $x_3, x_4$ form the second block of the first useful data bits and are transformed into the second block of useful data wits $y_4, y_5, y_6$ using the WOM code described in the table. Correspondingly, the useful data bits $x_5, x_6$ form the third block of the first useful data bits and are transformed into the third block of useful data wits $y_7, y_8, y_9$ using the WOM code described in the table.

As an example, the bit sequence $$x_1, \ldots, x_6 = 10\ 00\ 11$$

is considered as first useful data bits.

FIG. 1a illustrates a memory area 101 in which three blocks $[y_1, y_2, y_3]$, $[y_4, y_5, y_6]$ and $[y_7, y_8, y_9]$ of first useful data wits into which three blocks $[x_1, x_2]$, $[x_3, x_4]$ and $[x_5, x_6]$ of first useful data bits are coded using the WOM code in accordance with the table above are intended to be stored at an address $a_1, \ldots, a_5$. Said address reads for example: $a_1, \ldots, a_5 = 10011$.

The memory area 101 has a word width of 19 bits. Memory cells of the memory area 101 are designated by $Z^1, Z^2, \ldots, Z^{19}$ in FIG. 1a. The 19 bits are subdivided into 9 first (useful data) wits 102, five first check bits 103 and five second check bits 104.

The memory cells $Z^1, \ldots, Z^9$ serve for storing the data wits; the memory cells $Z^{10}, \ldots, Z^{19}$ serve for storing check bits.

By way of example, consideration is given to the case in which the memory area 101 is erased completely (and in an error-free manner) prior to writing. The memory cells $Z^i$, $i=1, \ldots, 19$ are thus in a state $z_i=0$ before they are written to.

In accordance with the bit sequence of useful data bits indicated by way of example above, the following relationships result for the blocks of in each case two useful data bits $x_1,x_2=10$, $x_3,x_4=00$, $x_5,x_6=11$, These blocks of useful data bits are coded into useful data wits in accordance with the table as follows:

$y_1,y_2,y_3=f^1(x_1,x_2)=f^1(1,0)=100$, $y_4,y_5,y_6=f^1(x_3,x_4)=f^1(0,0)=000$, $y_7,y_8,y_9=f^1(x_5,x_6)=f^1(1,1)=010$,

In the exemplary embodiment under consideration, check bits are intended to be formed using a (14,9) code C, wherein the code C is a shortened Hamming code having an H-matrix $$H = \begin{pmatrix} 1 & 0 & 0 & 0 & 0 & 1 & 1 & 1 & 1 & 0 & 0 & 0 & 0 & 0 \\ 0 & 1 & 0 & 0 & 0 & 1 & 0 & 0 & 0 & 1 & 1 & 1 & 0 & 0 \\ 0 & 0 & 1 & 0 & 0 & 0 & 1 & 0 & 0 & 1 & 0 & 0 & 1 & 1 \\ 0 & 0 & 0 & 1 & 0 & 0 & 0 & 1 & 0 & 0 & 1 & 0 & 1 & 0 \\ 0 & 0 & 0 & 0 & 1 & 0 & 0 & 0 & 1 & 0 & 0 & 1 & 0 & 1 \end{pmatrix} = (I_5, P_{5,9}^T) \quad (6)$$

and a G-matrix $$G = \begin{pmatrix} 1 & 1 & 0 & 0 & 0 & 1 & 0 & 0 & 0 & 0 & 0 & 0 & 0 & 0 \\ 1 & 0 & 1 & 0 & 0 & 0 & 1 & 0 & 0 & 0 & 0 & 0 & 0 & 0 \\ 1 & 0 & 0 & 1 & 0 & 0 & 0 & 1 & 0 & 0 & 0 & 0 & 0 & 0 \\ 1 & 0 & 1 & 0 & 1 & 0 & 0 & 0 & 1 & 0 & 0 & 0 & 0 & 0 \\ 0 & 1 & 1 & 0 & 0 & 0 & 0 & 0 & 0 & 1 & 0 & 0 & 0 & 0 \\ 0 & 1 & 0 & 1 & 0 & 0 & 0 & 0 & 0 & 0 & 1 & 0 & 0 & 0 \\ 0 & 1 & 0 & 0 & 1 & 0 & 0 & 0 & 0 & 0 & 0 & 1 & 0 & 0 \\ 0 & 0 & 1 & 1 & 0 & 0 & 0 & 0 & 0 & 0 & 0 & 0 & 1 & 0 \\ 0 & 0 & 1 & 0 & 1 & 0 & 0 & 0 & 0 & 0 & 0 & 0 & 0 & 1 \end{pmatrix} = (P_{9,5}, I_9) \quad (7)$$

wherein $$P_{9,5} = \begin{pmatrix} 1 & 1 & 0 & 0 & 0 \\ 1 & 0 & 1 & 0 & 0 \\ 1 & 0 & 0 & 1 & 0 \\ 1 & 0 & 1 & 0 & 1 \\ 0 & 1 & 1 & 0 & 0 \\ 0 & 1 & 0 & 1 & 0 \\ 0 & 1 & 0 & 0 & 1 \\ 0 & 0 & 1 & 1 & 0 \\ 0 & 0 & 1 & 0 & 1 \end{pmatrix}, \quad (8)$$

holds true and $$P_{5,9}^T = \begin{pmatrix} 1 & 1 & 1 & 1 & 0 & 0 & 0 & 0 & 0 \\ 1 & 0 & 0 & 0 & 1 & 1 & 1 & 0 & 0 \\ 0 & 1 & 0 & 0 & 1 & 0 & 0 & 1 & 1 \\ 0 & 0 & 1 & 0 & 0 & 1 & 0 & 1 & 0 \\ 0 & 0 & 0 & 1 & 0 & 0 & 1 & 0 & 1 \end{pmatrix} \quad (9)$$

is the transposed matrix of the matrix $P_{9,5}$.

In the present example, the five first check bits $c_1^1, c_2^1, c_3^1, c_4^1, c_5^1$ are determined in accordance with the relationship $$c_1^1, c_2^1, c_3^1, c_4^1, c_5^1 = f^1(x_1, x_2) f^2(x_3, x_4) f^1(x_5, x_6) \cdot P_{9,5} = \quad (10)$$

$$= f^1(10) f^1(00) f^1(11) \cdot P_{9,5} =$$

$$= 100000010 \cdot P_{9,5} =$$

$$= 100000010 \cdot \begin{pmatrix} 1 & 1 & 0 & 0 & 0 \\ 1 & 0 & 1 & 0 & 0 \\ 1 & 0 & 0 & 1 & 0 \\ 1 & 0 & 1 & 0 & 1 \\ 0 & 1 & 1 & 0 & 0 \\ 0 & 1 & 0 & 1 & 0 \\ 0 & 1 & 0 & 0 & 1 \\ 0 & 0 & 1 & 1 & 0 \\ 0 & 0 & 1 & 0 & 1 \end{pmatrix} = 11110$$

In a first write operation, therefore, at the address $a_1, \ldots, a_5=10011$ the first data wits 100000010 are written to the memory cells $Z^1, \ldots, Z^9$ and the first check bits 11110 are written to the memory cells $Z^{10}, \ldots, Z^{14}$.

FIG. 1b correspondingly shows the content or states of the memory area 101 having the address 10011 after the first write operation. In this case, the first check bits 11110 are formed from the first useful data wits and are not transformed into wits. The check bits are formed jointly for the first nine useful data wits (that is to say the three blocks of the first useful data wits). This has the advantage that fewer check bits are required compared with the case in which check bits would be formed for each individual block of wits.

In a second write operation, the blocks of the second six useful data bits $x'_1, x'_2=11$ $x'_3, x'_4=10$ $x'_5, x'_6=11$ are then intended to be coded as useful data wits and stored.

The wits 100 are stored in the first three memory cells $Z^1, Z^2, Z^3$ after the first write operation. The first block $x'_1, x'_2=11$ of the second useful data bits is coded into the second useful data wits $y'_1, y'_2, y'_3 = f^2(x'_1, x'_2) = f^2(1,1) = 101$ and written to the memory cells $Z^1, Z^2, Z^3$ which are occupied with 100 before the second writing process. The first useful data wits 100 are overwritten with the second useful data wits 101.

The wits 000 are stored in the second three memory cells $Z^4, Z^5, Z^6$ after the first write operation. The second block $x'_3, x'_4=10$ of the second useful data bits is coded into the second useful data wits $y'_4, y'_5, y'_6 = f^1(x'_3, x'_4) = f^1(1,0) = 100$ and written to the memory cells $Z^4, Z^5, Z^6$ which are occupied with 000 before the second writing process. The first useful data wits 000 are overwritten with the second useful data wits 100.

The wits 010 are stored in the third three memory cells $Z^7, Z^8, Z^9$ after the first write operation. The third block $x'_5, x'_6=11$ of the second useful data bits is coded into the second useful data wits $y'_7, y'_8, y'_9 = f^1(x'_5, x'_6) = f^1(1,1) = 010$ and written to the memory cells $Z^7, Z^8, Z^9$. The first useful data wits 010 are overwritten with the second useful data wits 010 having the same value.

It should be noted here that overwriting of identical values can optionally also be omitted. In the example above, this means that if the first useful data wits 010 are overwritten by second useful data wits 010, the actual write operation can be omitted.

To summarize, the following coding sequence accordingly arises in accordance with the present example here:

| first bits | Function | first wits | second bits | Function | second wits |
|---|---|---|---|---|---|
| $x_1 x_2 = 10$ | $f^1$ | 100 | $x_1', x_2' = 11$ | $f^2$ | 101 |
| $x_3 x_4 = 00$ | $f^1$ | 000 | $x_3', x_4' = 10$ | $f^1$ | 100 |
| $x_5 x_6 = 11$ | $f^1$ | 010 | $x_5', x_6' = 11$ | $f^1$ | 010 |

The five second check bits $c_1^2, \ldots, c_5^2$ are formed in accordance with the relationship $$c_1^2, c_2^2, c_3^2, c_4^2, c_5^2 = f_2(x_1', x_2') f_1(x_3', x_4') f_1(x_5', x_6') \cdot P_{9,5} = \quad (11)$$

$$= f_2(11) f_1(10) f_1(11) \cdot P_{9,5} =$$

$$= (101100010) \cdot P_{9,5} =$$

$$= (101100010) \cdot \begin{pmatrix} 1 & 1 & 0 & 0 & 0 \\ 1 & 0 & 1 & 0 & 0 \\ 1 & 0 & 0 & 1 & 0 \\ 1 & 0 & 1 & 0 & 1 \\ 0 & 1 & 1 & 0 & 0 \\ 0 & 1 & 0 & 1 & 0 \\ 0 & 1 & 0 & 0 & 1 \\ 0 & 0 & 1 & 1 & 0 \\ 0 & 0 & 1 & 0 & 1 \end{pmatrix} = 01001$$

The second nine useful data wits 101 100 010 are written to the memory cells $Z^1, \ldots, Z^9$ in the second write operation. The memory cells have the states $z_1^1, \ldots, z_9^1 = 100\ 000\ 010$ after the first write operation. The second write operation is applicable to these states because not a single state experiences a transition from 1 to 0.

The second check bits $c_1^2, c_2^2, c_3^2, c_4^2, c_5^2 = 01001$ are written to the memory cells $Z^{15}, \ldots, Z^{19}$ in the second write operation.

FIG. 1c shows the content or states of the memory cells $Z^1, \ldots, Z^{19}$ after the second write operation.

After the first write operation, the first nine useful data wits 100 000 010 are stored in the memory cells $Z^1, \ldots, Z^9$ and the first check bits 11110 are stored in the memory cells $Z^{10}, \ldots, Z^{14}$. This results in a code word of the code C under consideration (here: Hamming code):

11110 100 000 010.

After the second write operation, the second nine useful data wits 101 100 010 are stored in the memory cells $Z^1, \ldots, Z^9$ and the second check bits 01001 are stored in the memory cells $Z^{15}, \ldots, Z^{19}$. This results in a code word of the code C under consideration:

01001 101 100 010.

It is advantageous to store the first check bits 103 and the second check bits 104 without transforming them into wits. In this case, the combination of wits and check bits is not "WOM-coded". In this respect, e.g. known error correcting codes can be applied to data wits. Moreover, a coding of the check bits into check wits using a WOM code can have the effect that as a result of errors in the stored check wits additional errors occur in the check bits which are required for correcting the data wits.

If, for example, the bits 10 coded as wits $f^1(1,0)=1,0,0$ are written to a memory and if, for example, a 1-bit error occurs in the second position of the wits, such that 1,0,0 is corrupted to 1,1,0, then from the table it is evident that the wits 1,1,0 correspond to the bits 0,1:

WOM coding: $x_1, x_2 = 10 \rightarrow f^1(x_1, x_2) = 100$ 1-bit error in wits: $100 \rightarrow 110$ WOM decoding: $f^{-2}(110) = 01 \neq 10$ Consequently, a very frequently occurring 1-bit error in the check bits coded as wits can lead to a 2-bit error in the inverse-transformed bits. If the check bits were also stored in a WOM-coded manner, errors in the check wits could correspondingly affect the number of errors in the check bits, which would increase the complexity of the error correction and require more complex codes.

The number of check bits of a customary error correcting linear code having k information positions, for example of a Hamming code, of a Hsiao code or of a BCH code, increases proportionally to $\log_2(k)$ wherein $\log_2$ describes the logarithm to the base two, such that the number of check bits is small in comparison with the information positions particularly for large values of k.

Using WOM codes for transforming the relatively large number of useful data bits into useful data wits significantly reduces the number of required memory cells for storing the useful data. However, the relatively small number of memory cells for storing the check bits is doubled, for example. In the examples explained here, it is possible to use an error code C having a relatively small code distance which requires only a small number of check bits. That allows a fast error correction and requires a small chip area for realizing a decoding circuit and/or a coding circuit.

In the present example, the first check bits are stored in the memory cells $Z^{10}, \ldots, Z^{14}$ in the first write operation and the second check bits are stored in the second memory cells $Z^{15}, \ldots, Z^{19}$ in the second write operation.

When reading out the data from the memory area 102 it is known whether the memory was written to for the first time or for the second time or whether the check bits associated with the data wits read out are first check bits 103 or second check bits 104 (or it is known where the respective check bits are stored).

By way of example, the first check bits can be stored in a memory area of first check bits in the first write operation. Correspondingly, the second check bits can be stored in a memory area of second check bits in the second write operation. The two memory areas for first and second check bits can be embodied for example differently from one another, that is to say e.g. physically separately from one another. During reading after the respective write operation, the respectively appropriate physical memory is then addressed for access to the respective check bits.

Option: Data Wits and Associated Check Bits in Different Memory Areas

It is also possible to write data wits and associated check bits to different memory areas and/or to different memories.

If the data wits are stored for example in a first memory, in which a first binary value (for example 1) cannot be overwritten by a second binary value (for example 0)

(without the corresponding memory area being erased beforehand), then the check bits can also be written to a second memory, in which the stored bits can be overwritten arbitrarily. As a result, the word width of the values to be stored becomes smaller since then only either the first check bits or the second check bits are stored.

The memory for storing the data wits can be e.g. a flash memory; the memory for storing the check bits can be e.g. an SRAM. The SRAM can be loaded with the corresponding check bits e.g. upon initialization.

Furthermore, it is an option to use some other non-volatile memory for the check bits, for example an MRAM or an RRAM. Moreover, if appropriate, a (non-volatile) memory area already present in the system can be used or concomitantly used for this purpose.

Interpretation of the First Check Bits: Marker

As a further exemplary embodiment, an explanation is given below of how, on the basis of the states of the first memory cells for storing the check bits it is possible to determine whether the check bits associated with the data wits read out were stored in the first memory cells for storing check bits or in the second memory cells for storing check bits.

As shown by way of example above, the data wits formed from the blocks of the first data bits and the data wits formed from the blocks of the second data bits are written to the same memory cells at the address a.

The first check bits $c_1^1, \ldots, c_m^1$ of a code word of a code $C^1$ are written as first check bits to first memory cells for storing the first check bits. If the second check bits $c_1^2, \ldots, c_m^2$ of a code word of a code $C^2$ are written as second check bits to second memory cells for storing the second check bits, which are different than the first memory cells for storing the first check bits, then the first memory cells for storing the first check bits can be overwritten with a marker (also referred to as a flag or a marking), for example with the marker $$\underbrace{1, \ldots, 1}_{m}$$

if the marker itself is not a permissible check bit combination of a code word of the code $C^1$ used.

Moreover, it is possible to write the second check bits to the first memory cells for storing check bits if that is possible in an error-free manner and without an additional erasure operation, even though these memory cells had already been written to previously in the first write operation.

The second check bits can be written to the first memory cells for storing the check bits if none of those memory cells to which a check bit 0 (that is to say a state 0) is intended to be written in the second write operation is in a state 1 after the first write operation. In other words (without prior erasure, as already explained) a state change from 0 to 1 is possible, but not conversely from 1 to 0. Moreover, it is possible for a memory cell to remain in its state 0 or 1 without prior erasure.

If no error occurs, the second check bits in the second write operation can in particular then be written to the same memory cells as the first check bits, provided that $$m = m'$$

holds true, that is to say that the same number of memory cells is intended to be used for the check bits, and provided that $$c_1^2 \geq c_1^1, \ldots, c_m^2 \geq c_m^1$$

holds true.

Otherwise the second check bits can be written to the second memory cells for storing check bits, wherein in this case the first memory cells for storing check bits optionally acquire the marking $m_1, \ldots, m_m$, that is to say are correspondingly overwritten.

Such a procedure can be advantageous in particular if for example at an address $$a = a_1, a_2, a_3, a_4, a_5$$

the wits $$0, \ldots, 0$$

are intended to be stored, which are assigned the check bits $$\underbrace{0, \ldots, 0}_{m}$$

which can be overwritten by arbitrary values in an error-free manner.

By way of example, the value $$1, \ldots, 1$$

can be chosen as a marker. This is possible provided that this marker itself does not represent a valid check bit combination of a code word. Other markers can optionally also be used provided that they do not contribute to a (valid) code word.

When reading from the memory cells for storing the first check bits, these bits are used as first check bits if they are not identical to the marker. Otherwise, that is to say if the bits read in the memory cells for storing the first check bits are identical to the marker, then use is made of the memory cells for storing the second check bits as check bits.

An error can thus be detected if the bits read out from the memory cells of the first check bits are identical to the marker and the bits read out from the memory cells of the second check bits as check bits together with the wits read out do not form a valid code word or if the bits read out from the memory cells of the first check bits are not identical to the marker and these bits as check bits together with the wits read out do not form a valid code word.

Extension of the Code by $c_{m+1}$

A description is given below of an exemplary embodiment according to which, from a given code in which the bits $1, \ldots, 1$ are check bits of a code word, it is possible to determine a modified code in which the bits $1, \ldots, 1$ are not check bits of a valid code word.

If the given code has m check bits $c_1, \ldots, c_m$, then it is possible to add a further check bit $c_{m+1}$, such that $c_{m+1}$ is an XOR logic function (XOR: exclusive-OR) of an even number of check bits of the given code.

In this regard, it is possible, for example, to determine a further check bit $c_{m+1}$ from the first two check bits $c_1$ and $c_2$ in accordance with $$c_{m+1} = c_1 \oplus c_2$$

If $c_1=c_2=\ldots=c_m=1$ then $c_{m+1}=0$ and $$c_1,\ldots,c_{m+1} = \underbrace{1,\ldots,1}_{m+1}$$

are not check bits of a code word of the modified code.

Correspondingly, $m'=m+1$ memory cells can be provided for storing $m+1$ first check bits and just m memory cells can be provided for storing m second check bits. It is then not necessary for the $(m+1)$-th check bit derived from the first m check bits to be stored during the write operation in the memory cells for storing the second check bits since the marker is entered only into the first m' memory cells for storing the check bits.

It is also possible to add a plurality of additional check bits in order to derive from a given code a modified code containing a bit sequence $1,\ldots,1$ which are not check bits of a valid code word.

By way of example, let there be a code $C^2$ having 6 data bits and 6 check bits with the H-matrix $$H^2 = \begin{pmatrix} 1 & 0 & 0 & 0 & 0 & 0 & 1 & 0 & 1 & 0 & 1 & 0 \\ 0 & 1 & 0 & 0 & 0 & 0 & 1 & 0 & 0 & 1 & 0 & 1 \\ 0 & 0 & 1 & 0 & 0 & 0 & 1 & 0 & 1 & 0 & 0 & 1 \\ 0 & 0 & 0 & 1 & 0 & 0 & 0 & 1 & 1 & 0 & 0 & 1 \\ 0 & 0 & 0 & 0 & 1 & 0 & 0 & 1 & 0 & 1 & 1 & 0 \\ 0 & 0 & 0 & 0 & 0 & 1 & 0 & 1 & 0 & 1 & 0 & 1 \end{pmatrix} = (I_6, P_{6,6}^T) \quad (12)$$

and the G-matrix $$G^1 = \begin{pmatrix} 1 & 1 & 1 & 0 & 0 & 0 & 1 & 0 & 0 & 0 & 0 & 0 \\ 0 & 0 & 0 & 1 & 1 & 1 & 0 & 1 & 0 & 0 & 0 & 0 \\ 1 & 0 & 1 & 1 & 0 & 0 & 0 & 0 & 1 & 0 & 0 & 0 \\ 0 & 1 & 0 & 0 & 1 & 1 & 0 & 0 & 0 & 1 & 0 & 0 \\ 1 & 0 & 0 & 1 & 1 & 0 & 0 & 0 & 0 & 0 & 1 & 0 \\ 0 & 1 & 1 & 0 & 0 & 1 & 0 & 0 & 0 & 0 & 0 & 1 \end{pmatrix} = (P_{6,6}, I_6) \quad (13)$$

where $$P_{6,6} = \begin{pmatrix} 1 & 1 & 1 & 0 & 0 & 0 \\ 0 & 0 & 0 & 1 & 1 & 1 \\ 1 & 0 & 1 & 1 & 0 & 0 \\ 0 & 1 & 0 & 0 & 1 & 1 \\ 1 & 0 & 0 & 1 & 1 & 0 \\ 0 & 1 & 1 & 0 & 0 & 1 \end{pmatrix} \quad (14)$$

and $$P_{6,6}^T = \begin{pmatrix} 1 & 0 & 1 & 0 & 1 & 0 \\ 1 & 0 & 0 & 1 & 0 & 1 \\ 1 & 0 & 1 & 0 & 0 & 1 \\ 0 & 1 & 1 & 0 & 0 & 1 \\ 0 & 1 & 0 & 1 & 1 & 0 \\ 0 & 1 & 0 & 1 & 0 & 1 \end{pmatrix} \quad (15)$$

The vector $$c_1,\ldots,c_6,u_1,\ldots,u_6=1,\ldots,1=\text{All}{-}1$$

is a code vector since each row of the H-matrix contains an even number of ones and $$c_1,\ldots,c_6=1,\ldots,1$$

is a partial word of a code word. In this case, All−1 denotes a vector of all ones (composed of 12 ones in the present case).

A code $C^1$ is derived from the code $C^2$ by an additional check bit $$c_7 = c_1 \oplus c_3 = u_5 \oplus u_6$$

being added, such that $$c_1,\ldots,c_7 = \underbrace{1,\ldots,1}_{7}$$

is not a partial word of a code word.

For the G-matrix $G^1$ of the code $C^1$ it holds true that $$G^1 = \begin{pmatrix} 1 & 1 & 1 & 0 & 0 & 0 & 1 & 0 & 0 & 0 & 0 & 0 \\ 0 & 0 & 0 & 1 & 1 & 1 & 0 & 0 & 1 & 0 & 0 & 0 & 0 \\ 1 & 0 & 1 & 1 & 0 & 0 & 0 & 0 & 0 & 1 & 0 & 0 & 0 \\ 0 & 1 & 0 & 0 & 1 & 1 & 0 & 0 & 0 & 0 & 1 & 0 & 0 \\ 1 & 0 & 0 & 1 & 1 & 0 & 1 & 0 & 0 & 0 & 0 & 1 & 0 \\ 0 & 1 & 1 & 0 & 0 & 1 & 1 & 0 & 0 & 0 & 0 & 0 & 1 \end{pmatrix} = (P_{6,7}, I_6), \quad (16)$$

where $$P_{6,7} = \begin{pmatrix} 1 & 1 & 1 & 0 & 0 & 0 & 0 \\ 0 & 0 & 0 & 1 & 1 & 1 & 0 \\ 1 & 0 & 1 & 1 & 0 & 0 & 0 \\ 0 & 1 & 0 & 0 & 1 & 1 & 0 \\ 1 & 0 & 0 & 1 & 1 & 0 & 1 \\ 0 & 1 & 1 & 0 & 0 & 1 & 1 \end{pmatrix}. \quad (17)$$

If $c_1=c_3=1$ holds true, then $$c_7 = c_1 \oplus c_3 = u_5 \oplus u_6 = 0$$

and $$\underbrace{1,\ldots,1}_{7}$$

are not check bits of a valid code word of the code $C^1$.

FIG. 2 shows six memory cells 201 $Z^1,\ldots,Z^6$, seven memory cells 202 $Z^7,\ldots,Z^{13}$ and six memory cells 203 $Z^{14},\ldots,Z^{19}$. Binary values can be stored in these 19 memory cells 201 to 203 at an address 204 $a=a_1,a_2,a_3$, which is given here by 101 by way of example.

From two blocks $[x_1,x_2]$, $[x_3,x_4]$ of first data bits, in the first writing process in accordance with the WOM code (see table above) taking account of the states $z^1,z^2,z^3$, and $z^5,z^6,z^7$ of the memory cells $Z^1,Z^2,Z^3$ and $Z^4,Z^5,Z^6$, the two blocks of first data wits $[y_1,y_2,y_3]$ and $[y_5,y_6,y_7]$ are determined. If the memory cells 201 are erased completely and in an error-free manner and are in each case in the state 0, then it holds true that $$[y_1,y_2,y_3]=f^1([x_1,x_2])$$

and $$[y_4,y_5,y_6]=f^1([x_3,x_4]).$$

The first data wits $y_1,y_2,y_3,y_5,y_6$ are written to the memory cells 201 having the states $z_1^1, \ldots, z_6^1$ after the write operation. In the first write operation, first check bits $c_1^1, \ldots, c_7^1$ are determined in accordance with the code $C^1$ according to the relationship $$c_1^1, \ldots, c_7^1 = (f^1([x_1,x_2]), f^1([x_3,x_4])) \cdot P_{6,7} \quad (18)$$

and are written to the memory cells 202.

Since for the first check bits $$c_1^1, \ldots, c_7^1 \neq \underbrace{1, \ldots, 1}_{7}$$

holds true, the memory cells 202 are not occupied with seven successive binary 1-values 1111111 after the first writing process.

In the second write operation it is possible to determine from the two blocks $[x'_1,x''_2][x'_3,x'_4]$ of second data bits to be written and depending on the states $z_1^1, \ldots, z_6^1$ of the memory cells $Z^1, \ldots, Z^6$ the blocks of the second data wits in accordance with $$[y'_1,y'_2,y'_3]=f^{i_2}([x'_1,x'_2])$$

and $$[y'_4,y'_5,y'_6]=f^{i_2}([x'_3,x'_4])$$

In this case, $f^{i_2}$ denotes the transformation of the bits into wits which is to be used in the second write operation, and which depends on the value of the data wits written in the first write operation in the memory cells 201.

The second check bits $c_1^2, \ldots, c_6^2$ are formed in accordance with the code $C^2$ according to the relationship $$c_1^2, \ldots, c_6^2 = (f^{i_2}([x'_1,x'_2]), f^{i_2}([x'_3,x'_4])) \cdot P_{6,6} \quad (19)$$

and are written to the memory cells 203. The value $$\underbrace{1, \ldots, 1}_{7}$$

is then written to the memory cells 202.

In the first write operation the first seven check bits $c_1^1, \ldots, c_7^1$ are formed in accordance with the code $C^1$. In the second write operation the second six check bits are determined in accordance with the code $C^2$. By way of example, $C^1$ and $C^2$ are different codes.

It thus follows that:

if the value 1111111 is already stored in the memory cells 202, the check bits corresponding to the stored data wits are situated in the memory cells 203, that is to say the memory cells for storing the second check bits.

By contrast, if the value stored in the memory cells 202 for storing the first check bits is not equal to 1111111, the check bits corresponding to the stored data wits can be found in the memory cells 202 for storing the first check bits.

FIG. 2 shows the corresponding memory cells 201, 202 and 203 at the address 204 of the memory. The address 204 has the value 101, for example. 19 bits are stored at this address: 6 data wits, 7 first check bits and 6 second check bits. In the first write operation, the first check bits are stored in 7 memory cells 202 in accordance with the code $C^1$. In the second write operation, the second check bits are stored in 6 memory cells 203 in accordance with the code $C^2$, wherein the 7 first check bits of the memory cells 202 in this case are overwritten with the value 1111111. This value 1111111 is also referred to as a marking. The marking thus makes it possible to determine whether the critical check bits are the first check bits or the second check bits or whether the precisely relevant check bits can be found in the memory area 202 or in the memory area 203.

Example: Memory Cells are Partly in the State 1

By way of example, an explanation is given of a case in which a portion of the memory cells are in the state 1 before said memory cells are written to. Such a case can occur, for example, if not all the memory cells were successfully erased in a previous erasure operation on account of an aging memory.

By way of example, a block of two data bits $[x_1^1,x_2^1]$ is intended to be transformed into a block of three data wits $[y_1,y_2,y_3]$ using the WOM code in accordance with the table above, in order to write the data wits to memory cells $Z^1,Z^2,Z^3$ having the states $z_1,z_2,z_3$.

It is possible to write the wits $f^1([x_1^1,x_2^1])=y_1^1,y_2^1,y_3^1$ to the memory cells $Z^1,Z^2,Z^3$ in an error-free manner if it holds true that:

$$y_1^1 \geq z_1, y_2^1 \geq z_2, y_3^1 \geq z_3 \text{ or } z_1\bar{y}_1^1 \vee z_2\bar{y}_2^1 \vee z_2\bar{y}_3^1 = 0 \quad (20)$$

Furthermore, it is possible to write the wits $f^2([x_1^1,x_2^1])=y_1^2,y_2^2,y_3^2$ to the memory cells $Z^1,Z^2,Z^3$ in an error-free manner if it holds true that:

$$y_1^2 \geq z_1, y_2^2 \geq z_2, y_3^2 \geq z_3 \text{ or } z_1\bar{y}_1^2 \vee z_2\bar{y}_2^2 \vee z_2\bar{y}_3^2 = 0 \quad (21)$$

If $z_1,z_2,z_3=0,0,0$, for any occupancy of $[x_1^1,x_2^1]$ it is possible to write both $f^1([x_1^1,x_2^1])=y_1^1,y_2^1,y_3^1$ and $f^2([x_1^1, x_2^1])=y_1^2,y_2^2,y_3^2$ as a block of 3 wits to the memory cells.

For specific values $z_1,z_2,z_3$ it is possible to write a block $[x_1^1,x_2^1]$ of 2 data bits as a block of 3 data wits $f^i([x_1^1, x_2^1])=y_1^i,y_2^i,y_3^i$ where $i \in \{1,2\}$ in an error-free manner to memory cells $Z^1,Z^2,Z^3$ which are in the state $z_1,z_2,z_3$ if there is an i where $i \in \{1,2\}$, such that it holds true that:

$$z_1\bar{y}_1^i \vee z_2\bar{y}_2^i \vee z_3\bar{y}_3^i = 0 \quad (22)$$

If only one individual state of the three states $z_1,z_2,z_3$ assumes the value 1, then it is possible to write any occupancy of two bits $[x_1^1,x_2^1]$ coded as 3 wits to the corresponding memory cells in an error-free manner since for $f^1([x_1^1,x_2^1])=y_1^1,y_2^1,y_3^1$ and $f^2([x_1^1,x_2^1])=y_1^2,y_2^2,y_3^2$ according to the WOM code table above it holds true that:

$$y_1^1 = \bar{y}_1^2,$$

$$y_2^1 = \bar{y}_2^2,$$

$$y_3^1 = \bar{y}_3^2.$$

If only one of the states $z_1,z_2,z_3$, e.g. $z_1$, is equal to 1, then either $z_1\bar{y}_1^1 = 0$ or $z_1\bar{y}_1^2 = 0$.

It is also possible for states $z_1^{C^1}, \ldots, z_{m+1}^{C^1}$ or states $z_1^{C^2}, \ldots, z_m^{C^2}$ of memory cells $Z^{1,C^1}, \ldots, Z^{m+1,C^1}$ or $Z^{1,C^2}, \ldots, Z^{m,C^2}$ for storing check bits to be equal to 1 before the check bits are written to these memory cells.

In this regard, it is possible for the check bits $c_1, \ldots, c_{m+1}$ to be written to the memory cells $Z^{1,C^1}, \ldots, Z^{m+1,C^1}$ in an error-free manner if it holds true that:

$$z_1^{C^1}\overline{c}_1 \vee z_2^{C^1}\overline{c}_2 \vee \ldots \vee z_{m+1}^{C^1}\overline{c}_{m+1}=0 \qquad (23)$$

It is correspondingly possible to write the check bits $c_1, \ldots, c_m$ to the memory cells $Z^{1,C^2}, \ldots, Z^{m,C^2}$ having the states $z_1^{C^2}, \ldots, z_m^{C^2}$ if it holds true that:

$$z_1^{C^2}\overline{c}_1 \vee z_2^{C^2}\overline{c}_2 \vee \ldots \vee z_m^{C^2}\overline{c}_m=0 \qquad (24)$$

In this case, $C^1$ denotes the first code and $C^2$ denotes the second code.

If it is possible to write the first check bits $c_1, \ldots, c_{m+1}$ to the memory cells 202 $Z^{1,C^1}, \ldots, Z^{m+1,C^1}$ in an error-free manner, then said check bits are actually stored in said memory cells 202. By contrast, if it is not possible to write the first check bits to the memory cells 202 $Z^{1,C^1}, \ldots, Z^{m+1,C^1}$ in an error-free manner, then said first check bits—if that is possible—are written to the memory cells 203 $Z^{1,C^2}, \ldots, Z^{m,C^2}$.

Optionally, in this case, the marking, that is to say the value 1111111, can be written to the memory cells 202. It should be assumed here that the marking is not a valid code word of the first code $C^1$, that is to say that the following holds true:

$$c_1, \ldots, c_{m+1} \neq \underbrace{1, \ldots, 1}_{m+1}$$

If it is not possible to write the data bits coded as wits to the corresponding memory cells in an error-free manner or to write the check bits to the provided memory cells in an error-free manner, then it is an option to erase the memory area and then to write to it again, or else a different memory area can be used. This can be advantageous particularly if the original memory area has a defect.

A further option comprises determining a number of the memory cells possibly written to erroneously per memory area, and comparing this number with a predefined threshold value. In the event of the threshold value being reached and/or exceeded, the memory area can be erased in order then to be written to again. Alternatively, a different memory area can be used instead of this memory area.

It is also possible to determine a number $d_D$ of the memory cells to which data wits were written erroneously and to determine a number $d_P$ of the memory cells to which check bits were written erroneously and, depending on the values $d_D$ and $d_P$, to erase a specific memory area, or to use a different memory area.

The number of memory cells written to erroneously can be determined for example by a comparison of the data to be written with the data read out after the writing process.

A memory cell is in an erroneous state if it is in the state 1 before the writing process and a value 0 is written to this memory cell, wherein the state of the cell does not change, such that it erroneously has the value 1 after writing.

It is possible to erase a memory area if a state of a memory cell of this memory area is erroneous after writing.

It is also possible, for example, using an error correcting and/or error detecting code, to erase a memory area if a number of bit errors which are not correctable by the code are present. It is furthermore an option already to erase the memory area if a specific number of bit errors are present, even if this number would still be correctable by the code.

Example: Storing Useful Data Wits when Bit Errors Occur

A description will be given below of an example according to which k blocks $x^1, x^2, \ldots, x^k$ of useful data bits which are coded as k blocks $y^1, y^2, \ldots, y^k$ of useful data wits are stored in a memory at an address a if at least one error occurs.

$x^i$ denotes the useful data bits of the i-th block of useful data bits and $y^i$ denotes the useful data wits of the i-th block [$y^i$] of useful data wits where i=1, ..., k.

By way of example, the following steps can be carried out:

1. Coding the bits of the blocks of useful data bits $x^i$ into wits of the blocks of useful data wits to form overall a number of N useful data wits in accordance with a WOM code according to the relationship $$y^1=f^{i_1}(x^1), \ldots, y^k=f^{i_k}(x^k),$$

wherein for j=1, ..., k the coding functions $f^{i_j}$ of the WOM code used, depending on the states of the memory cells to which the wits of the block $y^j$ are written and depending on $x^j$, are selected from the possible coding functions of the WOM code such that a number $Anz1^j$ of the states of said memory cells which are equal to 1 and to which a with having the value 0 is written is minimal.

2. Determining m check bits $c=c_1, \ldots, c_m$, such that $$f^{i_1}(x^1), \ldots, f^{i_k}(x^k), c$$

bits of a code word of an error detecting and/or error correcting code C at least of the length N+m+1 result, wherein m≥1 holds true.

3. If the number of states of the memory cells which are equal to 1 and to which the value 0 is intended to be written reaches or exceeds a predefined threshold value $S_1$ where $S_1 \geq 0$, i.e. if the condition $$\sum_{j=1}^{k} Anz1^j \geq S_1$$

is fulfilled, the memory area addressed by the address a is erased.

4. Determining a number $Anz2^c$ of first memory cells for storing check bits which are in the state 1 and to which a check bit of the check bits c which has the value 0 is intended to be written at the address a.

5. If the number $Anz2^c$ reaches or exceeds a threshold value $S_2$ where $S_2 \geq 0$, that is to say if the following condition $$Anz2^c \geq S_2,$$

is fulfilled, a number $Anz3^c$ of second memory cells for storing check bits which are in the state 1 and to which a check bit of the check bits c having the value 0 is intended to be written to the address a is determined.

If the number $Anz3^c \leq S_3$, then the check bits c are written to the memory cells 203 of the second check bits, wherein $S_3 \geq 0$ is a predefined threshold value.

If the number $Anz3^c > S_3$, the memory area containing the address a is erased, wherein $S_3 \geq 0$ is a predefined threshold value.

6. If the condition $$\sum_{j=1}^{k} Anz1^j + Anz2^c \geq S_4$$

and/or the condition $$\sum_{j=1}^{k} Anz1^j + Anz3^c \geq S_4,$$

are/is fulfilled, wherein $S_4 \geq 0$ is a predefined threshold value, then the memory area containing the address a is erased.

The above steps thus check whether, for the useful data wits and/or the (first and/or second) check bits, there is (in each case) a number of memory cells which already have the state 1, to which the value 0 is intended to be written and which therefore can no longer be transformed to the state 0 without prior erasure. If this is the case and if the respective number or a combination of numbers exceeds a (at least one) threshold value, then the memory area is erased. It is advantageous here that the useful data wits in combination with the check bits can represent a code word of an error detecting and/or error correcting code, such that a specific set of erroneous bits (that is to say those bits which have the value 1 instead of the value 0) can be corrected.

If a t-bit error correcting code is used for example for determining the first check bits $c^1$ from the k blocks of the first data wits and for determining the second check bits $c^2$ from the blocks of the second data wits, then it is possible to correct all erroneous values of the memory cells which arise upon writing values 0 in memory cells which are in the state 1, if $S_4 \leq t$ holds true and if no further errors occur in the memory.

If $S_4 + \delta \leq t$ holds true, then even further $\delta$ memory errors can be corrected in addition to the erroneous values that occur upon writing a value 0 to those memory cells which are in the state 1.

Example: Detection of Address Errors

An exemplary embodiment is specified below according to which errors in the addresses can be detected.

The address bits can in this case be interpreted as additional bits. Such additional bits are, in particular, bits which are used in addition to the data wits for forming the check bits. Furthermore, it is an option to provide at least one inversion bit which is added to the data bits in order to describe whether and which data bits (or groups of data bits) were inverted. Additional bits can also comprise at least one indicator bit (password).

By way of example, a code C shall be specified having the code distance 3, the H-matrix $$H = \begin{pmatrix} 1 & 0 & 0 & 0 & 0 & 0 & 1 & 0 & 1 & 0 & 1 & 0 & 1 & 0 & 1 & 0 \\ 0 & 1 & 0 & 0 & 0 & 0 & 1 & 0 & 0 & 1 & 0 & 1 & 0 & 1 & 1 & 0 \\ 0 & 0 & 1 & 0 & 0 & 0 & 1 & 0 & 1 & 0 & 0 & 1 & 0 & 1 & 0 & 1 \\ 0 & 0 & 0 & 1 & 0 & 0 & 0 & 1 & 1 & 0 & 0 & 1 & 0 & 1 & 0 & 1 \\ 0 & 0 & 0 & 0 & 1 & 0 & 0 & 1 & 0 & 1 & 1 & 0 & 1 & 0 & 0 & 1 \\ 0 & 0 & 0 & 0 & 0 & 1 & 0 & 1 & 0 & 1 & 0 & 1 & 1 & 0 & 1 & 0 \end{pmatrix} = (I_6, P_{6,10}^T) \quad (25)$$

and the G-matrix $$G = \begin{pmatrix} 1 & 1 & 1 & 0 & 0 & 0 & 1 & 0 & 0 & 0 & 0 & 0 & 0 & 0 & 0 & 0 \\ 0 & 0 & 0 & 1 & 1 & 1 & 0 & 1 & 0 & 0 & 0 & 0 & 0 & 0 & 0 & 0 \\ 1 & 0 & 1 & 1 & 0 & 0 & 0 & 0 & 1 & 0 & 0 & 0 & 0 & 0 & 0 & 0 \\ 0 & 1 & 0 & 0 & 1 & 1 & 0 & 0 & 0 & 1 & 0 & 0 & 0 & 0 & 0 & 0 \\ 1 & 0 & 0 & 1 & 1 & 0 & 0 & 0 & 0 & 0 & 1 & 0 & 0 & 0 & 0 & 0 \\ 0 & 1 & 1 & 0 & 0 & 1 & 0 & 0 & 0 & 0 & 0 & 1 & 0 & 0 & 0 & 0 \\ 1 & 0 & 0 & 0 & 1 & 1 & 0 & 0 & 0 & 0 & 0 & 0 & 1 & 0 & 0 & 0 \\ 0 & 1 & 1 & 1 & 0 & 0 & 0 & 0 & 0 & 0 & 0 & 0 & 0 & 1 & 0 & 0 \\ 1 & 1 & 0 & 0 & 0 & 1 & 0 & 0 & 0 & 0 & 0 & 0 & 0 & 0 & 1 & 0 \\ 0 & 0 & 1 & 1 & 1 & 0 & 0 & 0 & 0 & 0 & 0 & 0 & 0 & 0 & 0 & 1 \end{pmatrix} = (P_{10,6}, I_{10}) \quad (26)$$

where $$P_{10,6} = \begin{pmatrix} 1 & 1 & 1 & 0 & 0 & 0 \\ 0 & 0 & 0 & 1 & 1 & 1 \\ 1 & 0 & 1 & 1 & 0 & 0 \\ 0 & 1 & 0 & 0 & 1 & 1 \\ 1 & 0 & 0 & 1 & 1 & 0 \\ 0 & 1 & 1 & 0 & 0 & 1 \\ 1 & 0 & 0 & 0 & 1 & 1 \\ 0 & 1 & 1 & 1 & 0 & 0 \\ 1 & 1 & 0 & 0 & 0 & 1 \\ 0 & 0 & 1 & 1 & 1 & 0 \end{pmatrix}. \quad (27)$$

All columns of the H-matrix have an odd number of ones, such that the code is a shortened Hsiao code. This shortened Hsiao code allows the correction of 1-bit errors and the detection of 2-bit errors.

By way of example, two blocks of data bits $[x_1,x_2]$ and $[x_3,x_4]$ are coded into two blocks of data wits $[y_1,y_2,y_3]$ and $[y_4,y_5,y_6]$ in accordance with the WOM code discussed here (see table above).

FIG. 3 symbolically shows a memory area comprising an address a, wherein 18 bits can be stored at each address a. These 18 bits correspond to 18 memory cells $Z^1, \ldots, Z^{18}$ and are subdivided into memory cells 301 for data wits (memory cells $Z^1, \ldots, Z^6$), memory cells 302 for first check bits $c^1 = c_1^1, \ldots, c_6^1$ (memory cells $Z^7, \ldots, Z^{12}$), and memory cells 303 for second check bits $c^2 = c_1^2, \ldots, c_6^2$ (memory cells $Z^{13}, \ldots, Z^{18}$).

The address a is subdivided into 4 bits, such that it holds true that: $a = a_1, a_2, a_3, a_4$.

The memory cells 301 serve for storing the data wits $y_1, \ldots, y_6$ of the blocks $[y_1,y_2,y_3]$, $[y_4,y_5,y_6]$ of the data wits.

The check bits $c^1=c_1^1, \ldots, c_6^1$ are determined with inclusion of the address $a=a_1, \ldots, a_4$ such that it holds true that $$c^1=c_1^1, \ldots, c_6^1 = (f^{i_1,1}([x_1,x_2]), f^{i_1,2}([x_3,x_4]), a_1, \ldots, a_4) \cdot P_{10,6}, \quad (28)$$

wherein the functions $f^{i_1,1}$, $f^{i_1,2}$ are the functions which transform the bits $x_1, \ldots, x_4$ of the blocks $[x_1,x_2]$, $[x_3,x_4]$ into the corresponding blocks of data wits in accordance with the WOM code according to the table indicated above, depending on the occupancy of the memory cells 301. If for example all the memory cells $Z^1, \ldots, Z^6$ are in the state 0 before the first write operation, it holds true that $f^{i_1,1}=f^{i_1,2}=f^1$.

In the example described here, in the first write operation the intention is to store the blocks $[x_1,x_2]=[1,0]$ and $[x_3,x_4]=[1,1]$ at the address 1010 and the blocks $[x'_1,x'_2]=[0,1]$ and $[x'_3,x'_4]=[0,1]$ at the address 1011 coded as data wits. It is assumed that all the memory cells 301 have the value 0 before the first write operation.

The block of the data bits $[x_1,x_2]=[1,0]$ is transformed into the block of the data wits $$[y_1,y_2,y_3]=f^1([1,0])=[1,0,0]$$

and the block of the data bits $[x_3,x_4]=[1,1]$ is transformed into the block of the data wits $$[y_4,y_5,y_6]=f^1([1,1])=[0,1,0]$$

Since the data wits $y_1, \ldots, y_6=100\ 010$ are intended to be stored at the address 1010, the check bits $c^1=c_1^1, \ldots, c_6^1$ result as $$c_1^1, \ldots, c_6^1 = (100\ 010\ 1010) \cdot P_{10,6} = 001\ 100.$$

The data wits $y_1, \ldots, y_6=100\ 010$ are stored in the memory cells 301 at the address 1010. The check bits $c_1^1, \ldots, c_6^1=001\ 100$ are stored in the memory cells 302 at the address 1010, and the memory cells 303 at the address 1010 remain in the state 0.

The block of the data bits $[x'_1,x'_2]=[0,1]$ is transformed into the block of the data wits $$[y'_1,y'_2,y'_3]=f^1([0,1])=[0,0,1]$$

and the block of the data bits $[x'_3,x'_4]=[0,1]$ is transformed into the block of the data wits $$[y'_4,y'_5,y'_6]=f^1([0,1])=[0,0,1]$$

Since the data wits $y'_1, \ldots, y'_6=001\ 001$ are intended to be stored at the address 1011, the check bits $c^{1'}=c_1^{1'}, \ldots, c_6^{1'}$ result as $$c_1^{1'}, \ldots, c_6^{1'} = (001\ 001\ 1011) \cdot P_{10,6} = 101\ 011.$$

The data wits $y'_1, \ldots, y'_6=001\ 001$ are stored in the memory cells 301 at the address 1011. The check bits $c_1^{1'}, \ldots, c_6^{1'}=101\ 011$ are stored in the memory cells 302 at the address 1011, and the memory cells 303 at the address 1011 remain in the state 0.

If, in the course of the intention of wanting to access the data stored at the address 1010, an address error occurs by virtue of the address 1010, being corrupted to 1011 e.g. as a result of an error within the memory, the data stored at the address 1011 are read out, even though the data stored at the address 1010 should have been read out. In the present case, therefore, the check bits $c_1^{1'}, \ldots, c_6^{1'}=101\ 011$ and the data wits $y'_1, \ldots, y'_6=001\ 001$ are read out. The latter are supplemented by the address bits 1010 of the address which would have been accessed without errors in the memory. This results in the code word:

$$c_1^{1'}, \ldots, c_6^{1'}, y'_1, \ldots, y'_6, a_1, \ldots, a_4 = 101\ 011\ 001\ 001\ 1010.$$

On account of the relationship $$s^T = H \cdot [101\ 011\ 001\ 001\ 1010]^T = [001110]^T \neq 0|$$

this code word is not a code word of the code C under consideration. The vector $s^T=[001110]$ is identical to the 16-th column of the H-matrix, which indicates an address error that is not corrected.

In the example shown here, the code word has a length of 16 bits. The 6 check bits (cf. memory cells 302) and the 6 data wits (cf. memory cells 301) form a subset of the 16 bits of this code word.

A subset of a set can be a proper subset of a set or the set itself.

In the example just considered, the 6 first check bits $c_1^1, \ldots, c_6^1$, the 6 data wits $y_1, \ldots, y_6$ and the 4 address bits $a_1, \ldots, a_4$, provided that no error occurs, form a code word of the used code of length 16. The 6 first check bits $c_1^1, \ldots, c_6^1$ and the 6 data wits $y_1, \ldots, y_6$ form a proper subset of the 16 bits of the set of all bits of a code word.

In the case where the address is not included in the coding, the totality of the check bits and data wits represents all bits of a code word whose subset is identical to the set of all bits of the code word.

Example: Taking Account of Bits Derived from Address Bits

An explanation is given of how e.g. instead of address bits $a_1, \ldots, a_n$, bits $A_1, \ldots, A_l$ derived from the address bits can be taken into account in the formation of the check bits.

By way of example, the bits $A_1, \ldots, A_l$ derived from the address bits $a_1, \ldots, a_m$ can be determined in accordance with $$A_1 = \varphi_1(a_1, \ldots, a_m),$$
$$\vdots$$
$$A_l = \varphi_l(x_1, \ldots, a_m),$$

wherein $\varphi_1, \ldots, \varphi_l$ are m-digit Boolean functions. By way of example, consideration is given below to the case in which $l \leq m$ holds true; however, it is also possible for $l > m$ to hold true.

In this regard, in accordance with one exemplary embodiment where $l=1$ and $A_l=A_1$, it is possible to use the following Boolean function:

$$A_1 = a_1 \oplus a_2 \oplus \ldots \oplus a_n,$$

wherein $\oplus$ denotes an exclusive-OR function. In this example, $A_1$ identifies the parity of the address bits. By way of example, for $m=4$, the following results:

$$A_1 = \varphi_1(a_1, \ldots, a_4) = a_1 \oplus a_2 \oplus a_3 \oplus a_4.$$

Each 1-bit error in the address bits $a_1, \ldots, a_4$ thus leads to an error in the derived bit $A_1$.

In another exemplary embodiment it is possible that $l=3$ and the derived bits $A_1, \ldots, A_3$ can be determined as follows:

$$A_1 = \varphi_1(a_1, \ldots, a_4) = a_3 \oplus a_4,$$

$$A_3 = \varphi_2(a_1, \ldots, a_4) = a_2 \oplus a_4,$$

$$A_3 = \varphi_3(a_1, \ldots, a_4) = a_1 \oplus a_4,$$

such that each 2-bit error in the address bits $a_1, \ldots, a_4$ leads to a different value in the derived address bits $A_1, A_2, A_3$. The Boolean functions $\varphi_1, \varphi_2, \varphi_3$ are linear here by way of example.

Alternatively, the derived bits could be determined as follows:

$$A_1 = \varphi_1(a_1, \ldots, a_4) = a_3 \oplus a_4 \vee \overline{(a_1 \vee a_2 \vee a_3 \vee a_4)},$$

$$A_2 = \varphi_2(a_1, \ldots, a_4) = a_2 \oplus a_4 \vee (a_1 \wedge a_2 \wedge a_3 \wedge a_4),$$

$$A_3 = \varphi_3(a_1, \ldots, a_4) = a_1 \oplus a_4,$$

In this example, the Boolean functions $\varphi_1$ and $\varphi_2$ are nonlinear and the Boolean function $\varphi_3$ is linear.

Example: Including the Bits Derived from the Address Bits in the Formation of the Check Bits An explanation is given below of how the bits $A_1, \ldots, A_l$ derived from the address bits can be included in the formation of the check bits.

In the following example $l=1$ holds true and the derived address bit $A_1$ is the parity bit of the bits of the addresses.

The two blocks $[x_1,x_2]$, $[x_3,x_4]$ of useful data bits are transformed into two blocks of useful data wits $[y_1,y_2,y_3]$, $[y_4,y_5,y_6]$ in accordance with the WOM code of the table above, depending on the states contained in the corresponding memory cells prior to writing.

FIG. 4 illustrates a memory area having an address 404 having the value 1010, for example, and 6 memory cells 401 for data wits (memory cells $Z^1, \ldots, Z^6$), 6 memory cells 402 for first check bits $c^1 = c_1^1, \ldots, c_6^1$ (memory cells $Z^7, \ldots, Z^{12}$) and 6 memory cells 403 for second check bits $c^2 = c_1^2, \ldots, c_6^2$ (memory cells $Z^{13}, \ldots, Z^{18}$).

The two blocks of data wits $[y_1,y_2,y_3]$ and $[y_4,y_5,y_6]$ can be stored at the address $a$ 404.

The first check bits $c^1 = c_1^1, \ldots, c_6^1$ are determined with the inclusion of the derived address bits, here the parity $$A_1 = a_1 \oplus a_2 \oplus a_3 \oplus a_4$$

of the address bits $a_1, \ldots, a_4$, such that it holds true that $$c^1 = c_1^1, \ldots, c_6^1 = (f^{i_1,1}([x_1,x_2]), f^{i_1,2}([x_3,x_4]), A_1) \cdot P_{7,6}, \quad (29)$$

wherein the functions $f^{i_1,1}$ and $f^{i_1,2}$ are the functions that transform the useful data bits $x_1, \ldots, x_4$ of the blocks $[x_1,x_2], [x_3,x_4]$ into the corresponding blocks of data wits in accordance with the WOM code depending on the occupancy of the memory cells $Z^1, Z^2, Z^3$ and $Z^4, Z^5, Z^6$.

As an example of a linear code C, use is made of a code having the G-matrix $$G = \begin{pmatrix} 1 & 1 & 1 & 0 & 0 & 0 & 1 & 0 & 0 & 0 & 0 & 0 \\ 0 & 0 & 0 & 1 & 1 & 1 & 0 & 1 & 0 & 0 & 0 & 0 \\ 1 & 0 & 1 & 1 & 0 & 0 & 0 & 0 & 1 & 0 & 0 & 0 \\ 0 & 1 & 0 & 0 & 1 & 1 & 0 & 0 & 0 & 1 & 0 & 0 \\ 1 & 0 & 0 & 1 & 1 & 0 & 0 & 0 & 0 & 0 & 1 & 0 \\ 0 & 1 & 1 & 0 & 0 & 1 & 0 & 0 & 0 & 0 & 0 & 1 \\ 1 & 0 & 0 & 0 & 1 & 1 & 0 & 0 & 0 & 0 & 0 & 0 \end{pmatrix} = (P_{7,6}, I_7) \quad (30)$$

where $$P_{7,6} = \begin{pmatrix} 1 & 1 & 1 & 0 & 0 & 0 \\ 0 & 0 & 0 & 1 & 1 & 1 \\ 1 & 0 & 1 & 1 & 0 & 0 \\ 0 & 1 & 0 & 0 & 1 & 1 \\ 1 & 0 & 0 & 1 & 1 & 0 \\ 0 & 1 & 1 & 0 & 0 & 1 \\ 1 & 0 & 0 & 0 & 1 & 1 \end{pmatrix} \quad (31)$$

By way of example, if all memory cells $Z^1, \ldots, Z^6$ are in the state 0 before the first write operation, it holds true that $f^{i_1,1} = f^{i_1,2} = f^1$.

In one example, in the first write operation, the intention is to store the blocks $[x_1,x_2]=[1,0]$ and $[x_3,x_4]=[1,1]$ at the address 1010 coded as data wits. From the address bits, the parity bit $A_1$ results as:

$$A_1 = 1 \oplus 0 \oplus 1 \oplus 0 = 0.$$

It shall be assumed again that all memory cells are in the state 0 before the first write operation.

The block of the data bits $[x_1,x_2]=[1,0]$ is transformed into the block of the data wits $$[y_1,y_2,y_3] = f^1([1,0]) = [1,0,0]$$

and the block of the data bits $[x_3,x_4]=[1,1]$ is transformed into the block of the data wits $$[y_4,y_5,y_6] = f^1([1,1]) = [0,1,0]$$

Since the data wits $y_1, \ldots, y_6 = 100\ 010$ are intended to be stored with the parity bit $A_1 = 0$ at the address 1010, the check bits $c^1 = c_1^1, \ldots, c_6^1$ result as $$c_1^1, \ldots, c_6^1 = (100\ 010\ 0) \cdot P_{7,6} = 011\ 110.$$

Example: Inclusion of Indicator Bits

It is also an option to take account of indicator bits $i_1, \ldots, i_L$ where $L > 0$ in the formation of the check bits.

In this case, indicator bits can form a password, for example, which is to be specified by a user when accessing the data. If the specified password is erroneous, an error can be indicated. In particular, the error can block outputting of the data. In another option, data are provided to different users from a memory via a data bus, wherein each user can only process the data which correspond to said user's own indicator bits or are filtered by means of said indicator bits.

By way of example, let there be a code C having the code distance 3 and the H-matrix $H=(I_6, P_{6,10}^T)$ in accordance with equation (25), the G-matrix $G=(P_{10,6}, I_{10})$ in accordance with equation (26) and the parity matrix $P_{10,6}$ in accordance with equation (27)

All columns of the H-matrix have an odd number of ones, such that the code is a shortened Hsiao code. This Hsiao code allows all 1-bit errors to be corrected and all 2-bit errors to be detected.

By way of example, two blocks of data bits $[x_1,x_2]$ and $[x_3,x_4]$ are coded into two blocks $[y_1,y_2,y_3]$ and $[y_4,y_5,y_6]$ of data wits in accordance with the WOM code specified by way of example here.

The check bits $c^1 = c_1^1, \ldots, c_6^1$ are determined with the inclusion of the indicator bits $i = i_1, \ldots, i_4$ as follows $$c^1 = c_1^1, \ldots, c_6^1 = (f^{i_1,1}([x_1,x_2]), f^{i_1,2}([x_3,x_4]), i_1, \ldots, i_4) \cdot P_{10,6}, \quad (32)$$

wherein the explanations above correspondingly hold true for the functions $f^{i_1,1}$, $f^{i_1,2}$.

In accordance with one example, in the first write operation, the intention is to store the blocks $[x_1,x_2]=[1,0]$ and $[x_3,x_4]=[1,1]$ at the address 1000 and the blocks $[x'_1,x'_2]=[0,1]$ and $[x'_3,x'_4]=[0,1]$ at the address 1001 coded as data wits. It shall again be assumed that all memory cells are in the state 0 before the first write operation.

The block of the data bits $[x_1,x_2]=[1,0]$ is transformed into the block of the data wits $$[y_1,y_2,y_3]=f^1([1,0])=[1,0,0]$$

and the block of the data bits $[x_3,x_4]=[1,1]$ is transformed into the block of the data wits $$[y_4,y_5,y_6]=f^1([1,1])=[0,1,0]$$

Since the data wits $y_1, \ldots, y_6=100\ 010$ are intended to be stored using the indicator bits 1010, the check bits $c^1=c_1^1, \ldots, c_6^1$ result as $$c_1^1, \ldots, c_6^1=(100\ 010\ 1010) \cdot P_{10,6}=001\ 100.$$

If the data at the address 1000 are intended to be read out and if a user incorrectly inputs the indicator bits 1001 instead of the indicator bits 1010 (that is to say an incorrect password), then no valid code word of the code C results from the data wits 100 010 read at the address 1000, check bits 001 100 and the incorrect indicator bits 1001. The outputting of the data wits can be prevented, e.g. blocked, in this case.

Example: Inversion of Data Bits

It is also an option to invert data bits before they are coded as data wits. In this case, at least one inversion bit is added to the data bits, wherein for example the data bits and the at least one inversion bit are coded jointly into data wits.

It is also possible to assign a subset of useful data bits to at least one inversion bit, wherein the useful data bits of the subset of the useful data bits which are assigned to the at least one inversion bit are not inverted if the inversion bit assumes a first value, and are inverted if the inversion bit assumes a second value different than the first value.

Moreover, it is an option to provide and include a plurality of inversion bits. In this case, different subsets of useful data bits can be assigned to different inversion bits.

Furthermore, it is a possibility to assign the same subset of useful data bits to a plurality of inversion bits.

For explanation purposes, one inversion bit is added in the following example, to which inversion bit all the useful data bits are assigned as a subset of the useful data bits.

FIG. 5a shows a memory area in which (for example after an erasure operation) not all memory cells at the address $a=10011$ were successfully erased.

A memory area having an address 504 having the value 10011, for example, is shown. On the basis of this address 10011, 19 memory cells $Z^1, \ldots, Z^{19}$ are addressed comprising 9 memory cells 501 for data wits (memory cells $Z^1, \ldots, Z^9$), 5 memory cells 502 for first check bits $c^1=c_1^1, \ldots, c_5^1$ (memory cells $Z^{10}, \ldots, Z^{14}$), and 5 memory cells 503 for second check bits $c^2=c_1^2, \ldots, c_5^2$ (memory cells $Z^{15}, \ldots, Z^{19}$).

After the incomplete (or erroneous) erasure operation, the memory cells $Z^1$, $Z^9$ and $Z^{14}$ are in each case in the state 1, and the other memory cells are in the state 0.

5 data bits $x_1, \ldots, x_5$ are intended to be written to the memory directly, i.e. in non-inverted fashion, or in inverted fashion as $\bar{x}_1, \ldots, \bar{x}_5$.

In this example, the data bits $x_1, \ldots, x_5$ are supplemented by an inversion bit $\text{Inv}_1$, the value of which indicates whether the data bits are coded into data wits directly or in inverted fashion and are written to the memory. In this case, the data bits are transformed into data wits directly or in inverted fashion jointly with at least one inversion bit. In particular, it is an option to add a plurality of inversion bits.

$\text{Inv}_1=0$ is intended to hold true if the data bits are not inverted.

$\text{Inv}_1=1$ is intended to hold true if the data bits are inverted. If $\text{Inv}_1=0$, the data bits $$x_1, \ldots, x_5, \text{Inv}_1=0$$

are coded into data wits and the data wits are written to the memory. If $\text{Inv}_1=1$, $$\bar{x}_1, \ldots, \bar{x}_5, \text{Inv}_1=1$$

are coded as data wits and the data wits are written to the memory.

If $\text{Inv}_1=0$, then the data bits and the inversion bit as 3 blocks $$[x_1,x_2],[x_3,x_4],[x_5,\text{Inv}_1=0]$$

are coded into 9 wits $$[y_1,y_2,y_3],[y_4,y_5,y_6],[y_7,y_8,y_9]$$

in accordance with the WOM code according to the table above as follows:

$$[y_1,y_2,y_3]=f^{i_1}([x_1,x_2]),$$

$$[y_4,y_5,y_6]=f^{i_2}([x_3,x_4]),$$

$$[y_7,y_8,y_9]=f^{i_3}([x_5,0]),$$

where $i_1,i_2,i_3 \in \{1,2\}$.

If $\text{Inv}_1=1$, the data bits and the inversion bit as 3 blocks $$[\bar{x}_1,\bar{x}_2],[\bar{x}_3,\bar{x}_4],[\bar{x}_5,\text{Inv}_1=1]$$

are coded into 9 wits $$[y_1^*,y_2^*,y_3^*],[y_4^*,y_5^*,y_6^*],[y_7^*,y_8^*,y_9^*]$$

in accordance with the WOM code in the table above as follows:

$$[y_1^*,y_2^*,y_3^*]=f^{i_4}([\bar{x}_1,\bar{x}_2]),$$

$$[y_4^*,y_5^*,y_6^*]=f^{i_5}([\bar{x}_3,\bar{x}_4]),$$

$$[y_7^*,y_8^*,y_9^*]=f^{i_6}([\bar{x}_5,1]),$$

where $i_4,i_5,i_6 \in \{1,2\}$.

As an example, the following data bits are considered:

$$x_1=0,x_2=1,x_3=1,x_4=1,x_5=1.$$

Firstly, the inversion bit $\text{Inv}_1$ is set to be equal to 0. In this case, however, it is not possible to transform all blocks $[x_1,x_2]$, $[x_3,x_4]$,$[x_5,0]$ into data wits by means of the function $f^{i_1}=f^{i_2}=f^{i_3}=f^1$ since for example $$f^1([x_1,x_2])=f^1(0,1)=y_1,y_2,y_3=0,0,1$$

holds true and the memory cell $Z^1$ in FIG. 5a already has the state 1 and the value $y_1=0$ cannot be written to it.

If the inversion bit $\text{Inv}_1$ is set to be equal to 1, then the inverted data bits can be transformed into data wits and be written to the memory, without the need to overwrite a state 1 already present in the memory with the value 0: it is thus possible to code the inverted data bits $[\bar{x}_1,\bar{x}_2]=[1,0]$ with the function $$f^{i_4}=f^1 \text{ as } f^1(0,1)=1,0,0$$

as data wits $y_1^*, y_2^*, y_3^*$ and to store them in the memory cells $Z^1, Z^2, Z^3$. It is likewise possible to code the inverted data bits $[\bar{x}_3, \bar{x}_4] = [0,0]$ with the function $$f^{i5} = f^1 \text{ as } f^1(0,0) = 0,0,0$$

and to code the inverted bit $\bar{x}_5$ and the inversion bit $\text{Inv}_1$ $[\bar{x}_5, 1] = [0,1]$ with the function $$f^{i6} = f^1 \text{ as } f^1(0,1) = 0,0,1$$

and to write them to the memory cells $Z^4, \ldots, Z^9$.

FIG. 5b shows that the wits 100, 000 and 001 are stored in the memory cells 501.

By virtue of the fact that, after the inversion of the data bits, all the inverted data bits and the inversion bit are transformed into data wits with the function $f^1$, the number of ones in the data wits is lower than if the function $f^2$ had been used at least once.

Since only the function $f^1$ (and not the function $f^2$) was used for transforming bits into wits in the first write operation in this example, even though the memory had not been erased in an error-free manner before the first write operation, in the second write operation it is still possible to store arbitrary values of bits in the second write operation. This would not be possible if the function $f^2$ of the WOM code had already been required for the first write operation (on account of the existing erase errors).

If at least one inversion bit is used, the check bits for a code C under consideration arise from
   the useful data bits,
   the at least one inversion bit,
   the occupancy (already present) of the memory cells to which the bits coded as wits are written, and
   if appropriate further bits, e.g.
   at least one address bit and/or
   at least one identifier bit.

One individual inversion bit is taken as a basis by way of example below, for the sake of clarity. However, the approach presented here is also correspondingly applicable to a multiplicity of inversion bits.

If the inversion bit is equal to 0, the useful data bits and the inversion bit $\text{Inv}_1 = 0$ are transformed block by block into blocks of data wits in accordance with the WOM code used, depending on the states of the corresponding memory cells. The check bits are determined such that the data wits and the check bits form a partial word of the code C.

If the inversion bit is equal to 1, the inverted useful data bits and the inversion bit $\text{Inv}_1 = 1$ are transformed block by block into blocks of data wits in accordance with the WOM code used, depending on the states of the corresponding memory cells. The check bits are determined such that the data wits and the check bits form a partial word of the code C.

It is also possible to use address bits or bits derived from address bits or indicator bits for forming the check bits. If address bits, bits derived from address bits or indicator bits are used when determining the check bits, it is not necessary to invert the address bits, the bits derived from address bits and/or the indicator bits if the inversion signal is equal to 1. It is an option to invert the address bits, the bits derived from the address bits and/or the indicator bits when determining the check bits if the inversion bit indicates that an inversion of the data bits was effected.

In the following example, no address bits, bits derived from address bits or indicator bits are taken into account when determining the check bits, for the sake of better clarity.

By way of example, the code C that is intended to be used is the linear code whose H-matrix is specified by equation (6), G-matrix by equation (7) and parity matrix by equation (8).

In the example, the inversion bit $\text{Inv}_1 = 1$, and the inverted data bits and the inversion bit 10 00 01 are transformed into the data wits 100 000 001, as described above.

The check bits $c_1^1, \ldots, c_5^1$ result as $$c_1^1, \ldots, c_5^1 = (f^1(\bar{x}_1, \bar{x}_2), f^1(\bar{x}_3, \bar{x}_4), f^1(\bar{x}_5, 1)) \cdot P_{9,5} =$$
$$= (100\ 000\ 001) \cdot P_{9,5} = 11101.$$

These check bits can be written to the memory cells $Z^{10}, \ldots, Z^{14}$; the value of the memory cell $Z^{14}$ previously occupied erroneously at 1 does not lead to a conflict here (cf. FIG. 5b).

The data wits 100 000 001 and the check bits 11101 form the code word $$11101\ 100\ 000\ 001$$

of the code C having the H-matrix according to equation (6). If an error occurs for example in the 7-th data with $y_7^*$, which error corrupts the value $y_7^* = 0$ to $y_7^* = 1$ then this results in an error syndrome $$H \cdot (11101\ 100\ 000\ 101)^T = (01001)^T,$$

which is identical to the 12-th column of the H-matrix in accordance with equation (6).

The initially erroneous wits and check bits 11101 100 000 101 are improved to the correct values 11101 100 000 001 on the basis of the error syndrome $(01001)^T$ in the 12-th column of the H-matrix in accordance with equation (6), said correct values being transformed into the useful data bits 10 00 01 in accordance with the WOM code. Since the inversion bit, here the 6-th bit, is equal to 1, said useful data bits are inverted into 01 11 10 which should be stored.

In particular, it is an advantage that the inversion bit, via the error correction of the data wits into which it is transformed jointly with the data bits, is included in the error correction and is protected against errors.

It is possible to use a plurality of inversion bits $\text{Inv}_1, \ldots, \text{Inv}_q$ with $q > 1$. By way of example, the following can be defined:
   $\text{Inv}_1 = 0, \ldots, \text{Inv}_q = 0$ if no inversion of the useful data bits is effected,
   and $\text{Inv}_1 = 1, \ldots, \text{Inv}_q = 1$ if an inversion of the useful data bits is effected before the wits are determined from the useful data bits and the inversion bits.

The q inversion bits can be included in the formation of the wits, such that after the storage of the wits, after the read-out, after an error correction of the wits and after the inverse transformation into useful data bits and inversion bits, it is possible to check whether or not the inversion bits are identical among one another.

If e.g. the number of inversion bits $q = 3$, it is possible, in the case where not all 3 inversion bits are identical among one another, to determine the value of the inversion bits with high error tolerance by means of a voter (a decision component) having 3 inputs and an output.

It is also possible to use at least one inversion bit for a respective subset of useful data bits. On the basis of this at least one inversion bit it is possible to determine whether the corresponding subset of useful data bits is inverted or not inverted. In this regard, by way of example, useful data bits $x_1, \ldots, x_{64}$ can be supplemented by 4 inversion bits $Inv_1$, $Inv_2$, $Inv_3$, $Inv_4$ as follows:

$$x_1, \ldots, x_{16}, Inv_1, x_{17}, \ldots, x_{32}, Inv_2, x_{33}, \ldots, x_{48}, Inv_3,$$
$$x_{49}, \ldots, x_{64}, Inv_4$$

In this case, the inversion bits $Inv_1$, $Inv_2$, $Inv_3$, $Inv_4$ are included in the formation of the data wits and thus in the error correction by the code C used.

Another option comprises using, in addition to inversion bits, address bits or bits derived from address bits for determining the corresponding check bits. It is likewise possible also to use identifier bits in addition to the inversion bits for forming check bits.

Furthermore, in one variant, in addition to the inversion bits, not only address bits or bits derived from address bits but also identifier bits are used for forming check bits.

Furthermore, nonlinear codes can be used instead of linear codes. By way of example, it is possible to determine the check bits from the wits and the additional bits using a Berger code.

Exemplary Circuit Arrangement

Figure 6:
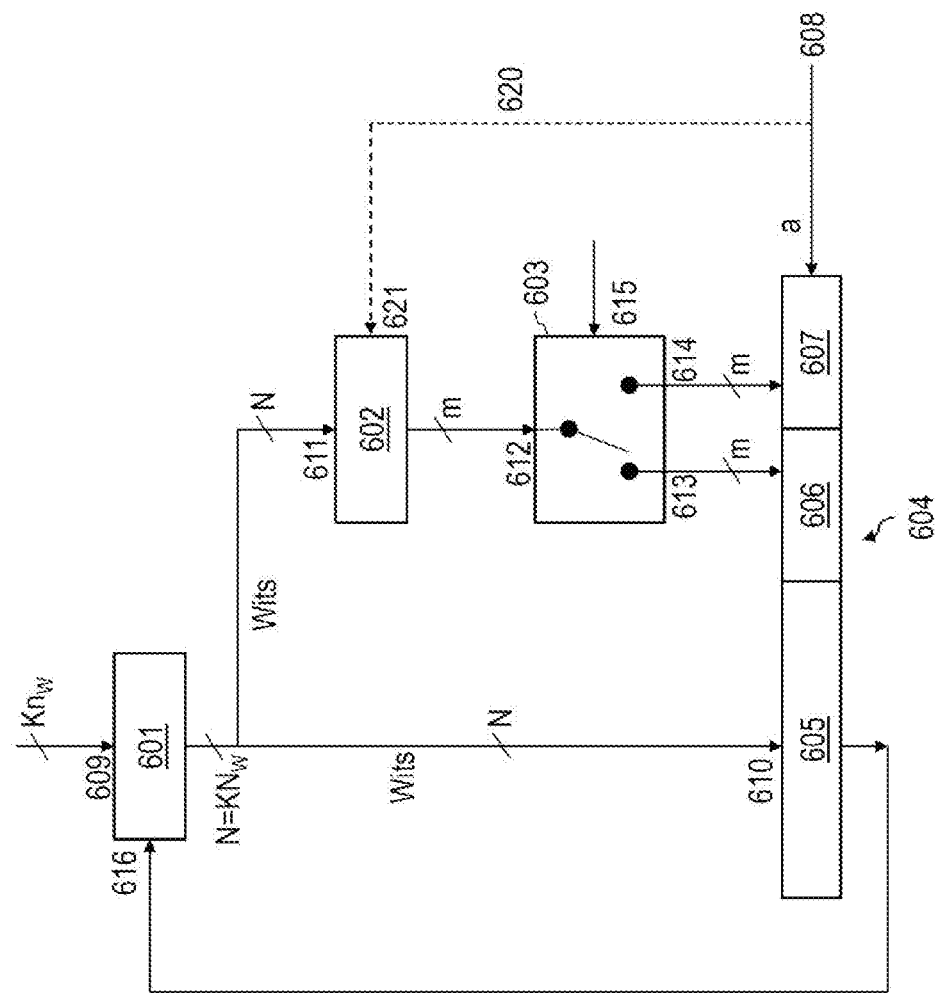
FIG. 6 shows one exemplary circuit arrangement for encoding.

FIG. 6 shows an exemplary circuit arrangement comprising a WOM coding unit 601, an error coding unit 602 (comprising an error detecting unit and/or an error correcting unit), a multiplexer 603 and an addressable memory 604.

The memory 604 has N memory cells 605 for storing N wits in two successive write operations at an address a, without the memory content having to be erased after the first write operation. Furthermore, the memory 604 comprises m memory cells 606 for storing m first check bits in a first write operation and m memory cells 607 for storing m second check bits in a second write operation. The value a of the current address is present at an address input 608.

At a first input 609 of the WOM coding unit 601, said first input having a width of $K \cdot n_W$ bits, K blocks $[x^1], \ldots, [x^K]$ of here in each case $n_W$ bits are present, wherein $K \geq 2$ and $n_W \geq 2$. Accordingly, $K \cdot n_W$ bits are present overall at the input 609.

The WOM coding unit 601 transforms (or codes) the K blocks $[x^1], \ldots, [x^K]$ of in each case $n_W$ useful data bits into K blocks $[y^1], \ldots, [y^K]$ of here in each case $N_W$ useful data wits, that is to say into a total of $N = K \cdot N_W$ wits y. These wits are applied to an input 610 of the memory 604 and stored in the N memory cells 605 at the address a. Furthermore, the N wits from the WOM coding unit 601 are applied to an input 611 of the error coding unit 602, said input having a width of N bits.

The error coding unit 602 forms, from the N wits y, present at its input 611, in accordance with the code $C^i$ used, a number of m check bits $c_1^i, \ldots, c_m^i$ that are output to a data input 612 of the multiplexer 603, said data input having a width of m bits. The multiplexer 603 has two outputs having a width of m bits in order to store the check bits provided by the error coding unit 602 either in the memory cells 606 as first check bits or in the memory cells 607 as second check bits. In this case, i=1 for the first write operation of the first check bits and i=2 stands for the second write operation of the second check bits.

The first check bits generated by the error coding unit 602 for the first write operation are accordingly designated by $c_1^1, \ldots, c_m^1$ and the second check bits for the second write operation are designated by $c_1^2, \ldots, c_m^2$.

For the first write operation, the multiplexer 603 receives a control signal s=1 via an input 615 and connects the data input 612 to a data output 613, such that the first check bits $c_1^1, \ldots, c_m^1$ are present at m data inputs of m memory cells 606 at the address a and can be stored in said memory cells.

For the second write operation, the multiplexer 603 receives a control signal s=2 via the input 615 and connects the data input 612 to a data output 614, such that the second check bits $c_1^2, \ldots, c_m^2$ are present at m data inputs of m memory cells 607 at the address a and are stored in said memory cells.

The formation of the wits by the WOM coding unit 601 is effected both depending on the blocks—to be coded as wits—of data bits fed via the input 609 and depending on the values of the states of the memory cells 605; the latter dependence is represented by a connection between the memory cells 605 and an input 616 of the WOM coding unit 601.

In this example in accordance with FIG. 6, the check bits are written to the memory 604 directly and not in a manner coded as wits.

Optionally, the address a for addressing the memory 604 can also be fed to an input 621 of the error coding unit 602. This embodiment is indicated as connection 620 in FIG. 6. The check bits can thus be formed depending on the N wits y and on the current address a by means of the error coding unit 602. In accordance with the example shown here, the error coding unit 602 can create the check bits $c_1^i, \ldots, c_m^i$ such that $$y, a, c_1^i, \ldots, c_m^i$$

is a code word of the code $C^i$, wherein i=1 stands for the first write operation and i=2 stands for the second write operation.

A further option comprises the formation of the check bits $c_1^i, \ldots, c_m^i$ being dependent on bits derived from address bits and/or on (arbitrary, e.g. predefined or predefinable) identifier bits. In such a case, the error coding unit 602 has for example at least one further input (not illustrated in FIG. 6) for inputting the bits derived from the address bits and/or for inputting identifier bits. Moreover, an input can be provided via which identifier bits that are currently to be input and to be verified can be provided e.g. by a user or a program, such that it is possible to compare predefined identifier bits with identifier bits currently input or received. The comparison as to whether the identifier bits are correct is carried out by checking whether a code word is present.

Figure 7:
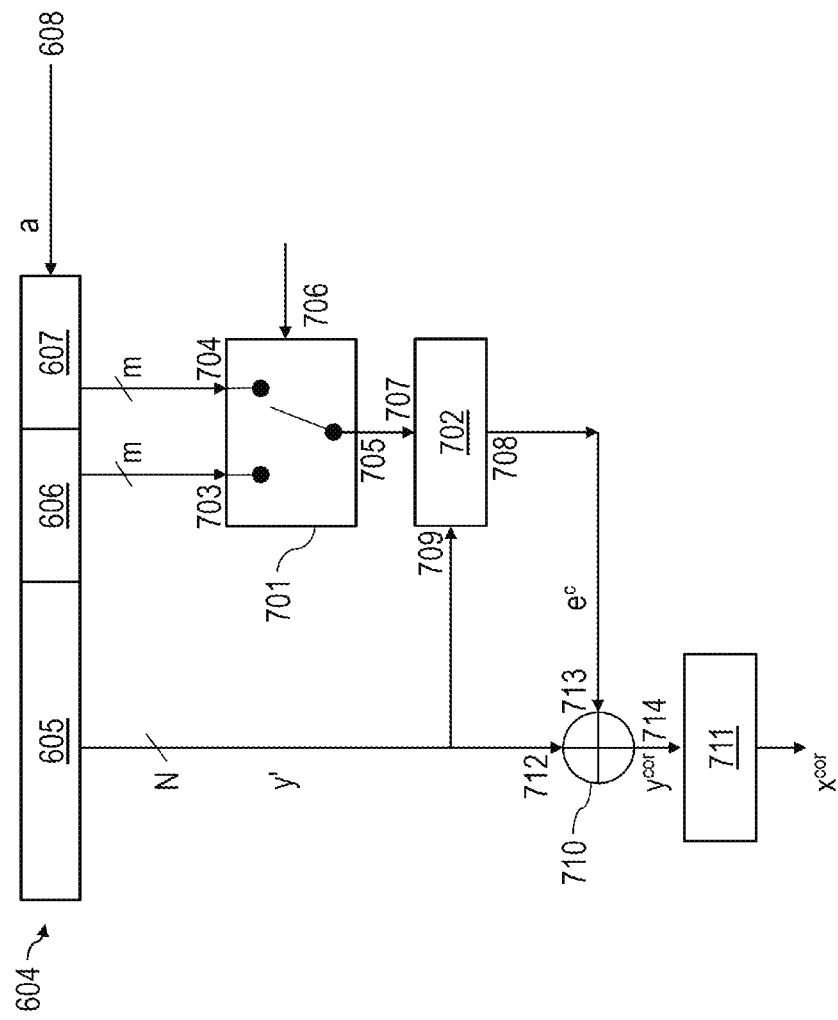
FIG. 7 shows one exemplary circuit arrangement for decoding.

FIG. 7 shows a diagram of a circuit arrangement for correcting stored wits obtained possibly erroneously during read-out from the memory.

from the memory 604, N wits y' are read out from N memory cells 605 and in a first read operation m first check bits $c^{1'} = c_1^{1'}, \ldots, c_m^{1'}$ in are read out from m memory cells 606 and in a second read operation m second check bits $c^{2'} = c_1^{2'}, \ldots, c_m^{2'}$ are read out from m memory cells 607 at the address a.

The wits and also the check bits can contain erroneous bits. The first check bits $c^{1'}$ are present at a data input 703 of a demultiplexer 701, said data input having a width of m bits, and the second check bits $c^{2'}$ are present at an input 704 of the demultiplexer 701, said input having a width of m bits.

The demultiplexer 701 receives a control signal $s^{DMUX}$ via an input 706. If $s^{DMUX}$ 0, the input 703 is connected to an output 705 of the demultiplexer 701; if $S^{DMUX}$ 1, then the input 704 is connected to the output 705.

The output 705 of the demultiplexer 701 is connected to an input 707 of a correction unit 702.

The correction unit 702 provides at an output 708 an N-component correction vector $$e^c = e_1^c, \ldots, e_N^c$$

for correcting the possibly erroneous wits $y'=y'_1, \ldots, y'_N$. The correction unit 702 furthermore has an input 709 which is connected to the memory cells 605 and receives the N wits via this connection.

An XOR circuit 710 has two inputs 712 and 713 having a width of N bits and an output 714 having a width of N bits. The input 712 is connected to the memory cells 605 and the input 713 is connected to the output 708 of the correction unit 702. Via the output 714, the possibly erroneous wits $y'=y'_1, \ldots, y'_N$ are XORed with the correction vector $e^c$ component by component to form the corrected wits $$y^{cor} = y_1^{cor}, \ldots, y_N^{cor}$$

such that it holds true that:

$$y' \oplus e^c = y'_1 \oplus e_1^c, \ldots, y'_N \oplus e_N^c = y^{cor}.$$

The corrected wits $y^{cor}$ are provided via the output 714 to a wits decoding unit 711. The wits decoding unit forms the corrected bits $x^{cor}$ block by block from the corrected wits $y^{cor}$.

For $i=1, \ldots, N$, the bit $c_i^{cor}=1$ if the with $y'_i$ is corrected, and the bit $c_i^{cor}=0$ if the with $y'_i$ is not corrected.

Figure 8:
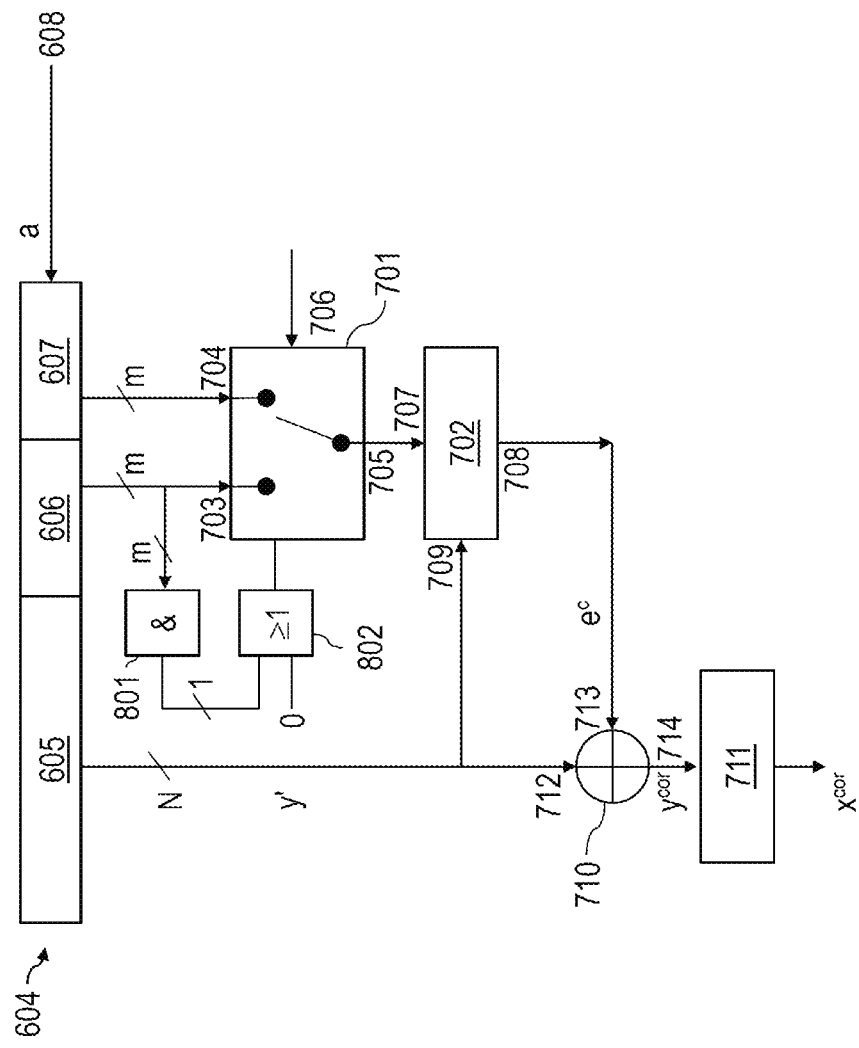
FIG. 8 shows one exemplary circuit arrangement in which a multiplexer is controlled depending on a marking signal of the first check bits.

FIG. 8 shows an optional extension of the circuit arrangement from FIG. 7, wherein a marker (e.g. in the form of m successive bits having the value 1) can be used for selecting the check bits when reading out the wits and the check bits.

The first check bits are read out from the memory cells 606 and are present at an input of an AND gate 801, said input having a width of m bits. At the output of the AND gate 801, said output having a width of 1 bit, the value 1 is thus provided if all m bits at the input of the AND gate 801 also have the value 1, that is to say if the first check bits are identical to the marker.

The output of the AND gate 801 is connected to a first input of an OR gate 802, at the second input of which the value 0 is present. An output of the OR gate 802 is connected to the input 706 of the demultiplexer 701.

If the first check bits are not identical to the marker, that is to say $$c^1 \neq \underbrace{1, \ldots, 1}_{m},$$

then the control value 0 is present at the input 706 of the demultiplexer 701. By contrast, if the first check bits correspond to the marker, that is to say $$c^1 = \underbrace{1, \ldots, 1}_{m},$$

then the control value 1 is present at the input 706.

The demultiplexer 701 connects the input 703 to the output 705 if the control value 0 is present, and it connects the input 704 to the output 705 if the control value 1 is present.

Consequently, the first possibly erroneous check bits $c^{1'}$ are output at the output 705 by the demultiplexer 701 if the memory cells 606 are not occupied with the marker. By contrast, the second possibly erroneous check bits $c^{2'}$ are output at the output 705 if the memory cells 606 are occupied with the marker.

By way of example, a memory arrangement can be provided which comprises a non-volatile memory for storing the first and second data wits $y^1$ and $y^2$ and for storing the corresponding first and second check bits $c^1$ and $c^2$. Moreover, the memory arrangement can for example additionally comprise a volatile memory for storing the first and second check bits $c^1$ and $c^2$ or for temporarily storing a copy of the first and second check bits $c^1$ and $c^2$. In this case it is possible to carry out, in a targeted manner, bit manipulations on the check bits stored in the volatile memory in the context of a system integration test, without the check bits stored in the non-volatile memory having to be altered.

The volatile memory can comprise an SRAM or DRAM, for example. The non-volatile memory can be embodied e.g. as an EEPROM.

The invention claimed is:

1. A method for storing bits in memory cells of a memory, comprising:
    writing first wits and second wits to identical memory cells at an identical address of the memory via two successive write operations, without the memory cells being erased after a first write operation of the two successive write operations; and
    storing first check bits in further first memory cells and second check bits in further second memory cells,
    wherein the number of first check bits is less than the number of the first wits, and
    wherein the memory cells are physical memory cells susceptible to at least one of transient memory errors or permanent memory errors.

2. The method as claimed in claim 1,
    wherein a first code word of a first error code is determined on the basis of the first wits and the first check bits,
    wherein a second code word of a second error code is determined on the basis of the second wits and the second check bits.

3. The method as claimed in claim 1, wherein the first wits and the second wits are determined on the basis of useful data bits by means of at least one WOM code.

4. The method as claimed in claim 3, wherein at least one inversion bit is added to the useful data bits, wherein a subset of useful data bits is assigned to the at least one inversion bit.

5. The method as claimed in claim 4, wherein the at least one inversion bit assumes a first value if the useful data bits assigned to the inversion bit are not inverted, and the inversion bit assumes a second value different therefrom if the useful data bits assigned to the inversion bit are inverted.

6. The method as claimed in claim 5, wherein the respective wits are formed using the useful data bits and the inversion bit, wherein the useful data bits assigned to the at least one inversion bit are not inverted if the inversion bit has the first value, and wherein the useful data bits assigned to the at least one inversion bit are inverted if the inversion bit has the second value.

7. The method as claimed in claim 4, wherein in the first write operation the first check bits are determined such that the first wits determined from the useful data bits and the at least one inversion bit and the first check bits are bits of the first code word, and wherein in the second write operation at the same address the second check bits are determined such that the second wits determined from the useful data bits and the at least one inversion bit and the second check bits are bits of the second code word.

8. The method as claimed in claim 4, wherein the useful data bits assigned to the at least one inversion bit are all useful data bits.

9. The method as claimed in claim 3,
wherein before the write operation, in memory cells to be addressed, the data stored there are read out,
wherein the data read out are compared with the data to be stored,
wherein the data to be stored are inverted if the data to be stored cannot be written to the memory in an error-free manner,
wherein the first wits or the second wits are determined on the basis of the inverted data by means of the at least one WOM code and are stored in the memory cells.

10. The method as claimed in claim 3, wherein the first wits coded by means of the at least one WOM code are different than the second wits coded by means of the at least one WOM code.

11. The method as claimed in claim 3, wherein at least one memory cell of the memory is not completely erased before the first writing, wherein the first wits and the second wits are coded by means of the at least one WOM code on the basis of the at least one not completely erased memory cell.

12. The method as claimed in claim 3, wherein the first wits and the second wits are organized in each case as blocks, wherein two different codings are assigned to each occupancy of the bits of one of the blocks of the first wits by the at least one WOM code.

13. The method as claimed in claim 1, wherein the number of second check bits is less than the number of second wits.

14. The method as claimed in claim 1, wherein the first error code is an error detecting code and/or an error correcting code, and wherein the second error code is an error detecting code and/or an error correcting code.

15. The method as claimed in claim 1, wherein the first error code is a code having a code distance of greater than or equal to three.

16. The method as claimed in claim 1, wherein the second error code is a code having a code distance of greater than or equal to three.

17. The method as claimed in claim 1, wherein the further first memory cells and the further second memory cells are different than one another.

18. The method as claimed in claim 1, wherein if no error occurs, the first wits and the first check bits are a proper subset of bits of the first code word, or the second wits and the second check bits are a proper subset of bits of the second code word, or the first wits and the first check bits are a proper subset of the bits of the first code word and also the second wits and the second check bits are a proper subset of the bits of the second code word.

19. The method as claimed in claim 1, wherein the length of the first error code is greater than the number of first wits and first check bits, and wherein the length of the second error code is greater than the number of second wits and second check bits.

20. The method as claimed in claim 1, wherein the first code word of the first error code is determined on the basis of the first wits, the first check bits and first additional bits, and wherein the second code word of the second error code is determined on the basis of the second wits, the second check bits and second additional bits.

21. The method as claimed in claim 20, wherein when writing to the memory and/or when reading from the memory, the first wits, the first check bits and the first additional bits form the first code word and the second wits, the second check bits and the second additional bits form the second code word.

22. The method as claimed in claim 20, wherein the first additional bits and/or the second additional bits are based in each case at least on one of the following items of information:
address information,
address information concerning a write address or a read address,
information derived from address information,
identifier information,
password information,
inversion information.

23. The method as claimed in claim 20, wherein an error in the first additional bits is detected and/or corrected, and/or wherein an error in the second additional bits is detected and/or corrected.

24. The method as claimed in claim 1, wherein a marking is stored in the first further memory cells provided that the second check bits are stored in the further second memory cells.

25. The method as claimed in claim 24, wherein the marking is a bit sequence that does not constitute a valid bit sequence of the first check bits.

26. The method as claimed in claim 1, wherein a partial area of the memory is erased which comprises the address to which a write operation was applied if the first or second wits to be stored at $d_N$ positions do not have the desired state after the write operation and/or if the first check bits or the second check bits at $d_P$ positions do not have the desired state after the write operation.

27. The method as claimed in claim 1, wherein a second partial area of the memory is used if the first or second wits to be stored at $d_N$ positions do not have the desired state after the write operation to a first partial area and/or if the first check bits or the second check bits at $d_P$ positions do not have the desired state after the write operation.

28. The method as claimed in claim 26, wherein the partial area is erased or the second partial area is used instead of the first partial area if it holds true that $d_N+d_P \leq S_2$, wherein $S_2$ is a threshold value for which $S_2 \geq 0$ holds true.

29. The method as claimed in claim 1, wherein the further first memory cells and the further second memory cells are different than one another if the first check bits cannot be overwritten by the second check bits without a predefined number of erroneous memory cells occurring.

30. The method as claimed in claim 29, wherein the predefined number of erroneous memory cells is greater than or equal to zero.

31. The method as claimed in claim 1, wherein the number of first check bits is greater than one, and wherein the number of second check bits is greater than one.

32. The method as claimed in claim 1, wherein the memory comprises at least one of the following types of memories:
a volatile memory;
a non-volatile memory.

33. A device for storing bits in memory cells of a memory comprising:
a processing unit configured to:
write first wits and second wits to identical memory cells at an identical address of the memory via that in two successive write operations, without the memory cells being erased after a first write operation of the two successive write operations; and
store first check bits in further first memory cells and second check bits in further second memory cells,
wherein the number of first check bits is less than the number of the first wits, and wherein the memory cells are physical memory cells susceptible to at least one of transient memory errors or permanent memory errors.

34. The device as claimed in claim 33, wherein the processing unit is further configured to:
   determine a first code word of a first error code is determined on the basis of the first wits and the first check bits; and
   determine a second code word of a second error code on the basis of the second wits and the second check bits.

35. The device as claimed in claim 33, wherein the device comprises the further first memory cells and the further second memory cells.

36. The device as claimed in claim 33, wherein at least one of the further first memory cells or the further second memory cells comprises at least one of a non-volatile memory or a volatile memory.

37. The method as claimed in claim 1, wherein the memory is a flash memory.

\* \* \* \* \*